United States Patent [19]
Hirano

[11] Patent Number: 6,072,722
[45] Date of Patent: Jun. 6, 2000

[54] METHOD OF DRIVING A NONVOLATILE SEMICONDUCTOR STORAGE DEVICE

[75] Inventor: Yasuaki Hirano, Yamatokooriyama, Japan

[73] Assignee: Sharp Kabushiki Kaisha, Osaka, Japan

[21] Appl. No.: 09/111,664

[22] Filed: Jul. 8, 1998

[30] Foreign Application Priority Data

Jul. 9, 1997 [JP] Japan ................................. 9-183558

[51] Int. Cl.⁷ .................................................. G11C 16/00
[52] U.S. Cl. .............................. 365/185.13; 365/185.18; 365/185.27; 365/185.28; 365/185.29
[58] Field of Search ......................... 365/185.23, 185.13, 365/185.27, 185.28, 185.29, 185.18

[56] References Cited

U.S. PATENT DOCUMENTS

| | | | |
|---|---|---|---|
| 5,267,209 | 11/1993 | Yoshida | 365/185.27 |
| 5,365,484 | 11/1994 | Cleveland et al. | 365/185.13 |
| 5,402,371 | 3/1995 | Ono | 365/185.18 |
| 5,717,636 | 2/1998 | Dallabora | 365/185.13 |
| 5,777,922 | 7/1998 | Choi et al. | 365/185.23 |
| 5,784,325 | 7/1998 | Arase et al. | 365/185.28 |
| 5,898,616 | 4/1999 | Ono | 365/185.13 |
| 5,920,506 | 7/1999 | Wang et al. | 365/285.18 |

FOREIGN PATENT DOCUMENTS 6-120515  4/1994  Japan .

OTHER PUBLICATIONS

"AND" cell structure for a 3 V–only 64Mbit Flash Memory, IEICE, pp:37–43.

Memory Array Architecture and Decoding Scheme for 3 V Only Sector Erasable DINOR Flash Memory, IEEE Journal of Solid–State Circuits, vol. 29, No. 4 (1994), pp:454–9.

An Experimental 4–Mb Flash EEPROM with Sector Erase, IEEE Journal of Solid–State Circuits, vol. 26, No. 4 (1991), pp:484–91.

A Novel Programming Method Using a Reverse Polarity Pulse in Flash EEPROMs, IEICE TRNS. Electron., vol. E79–C, No. 6 (1996), pp:832–5.

*Primary Examiner*—Tan T. Nguyen
*Attorney, Agent, or Firm*—Morrison & Foerster LLP

[57] ABSTRACT

For programming data "0", a reference voltage Vss (e.g., 0 V) is applied to a drain and a source of a memory cell to be programmed via a corresponding main bit line, a corresponding select transistor, and a corresponding local bit line, while a second voltage Vpp (e.g., 15 V) is applied to a control gate of the memory cell via a word line connected with the memory cell. As a result, electrons are injected from the drain, source and channel region to a floating gate of the memory cell via its tunnel oxide. For erasing the memory cell, a third voltage Vds (e.g., 0–6 V) is applied to a semiconductor substrate of the memory cell and a fourth voltage Vneg (e.g., –10 V) is applied to the control gate via the word line. At this time, the third voltage is also applied to the source and drain. Alternatively, the source and drain of the memory cell are placed in a floating state. Consequently, electrons are ejected from the floating gate to the channel region via the tunnel oxide.

13 Claims, 17 Drawing Sheets

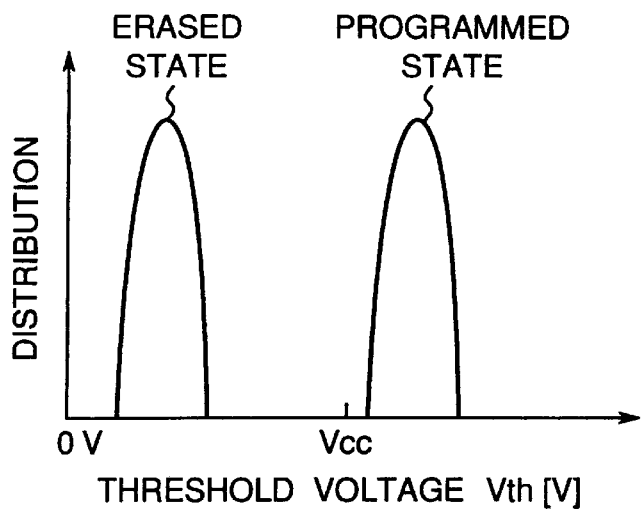
Fig.6
Fig.7A SSG
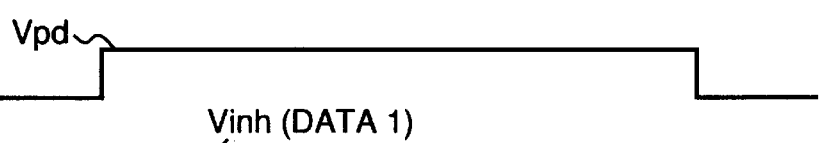
Fig.7B DSG
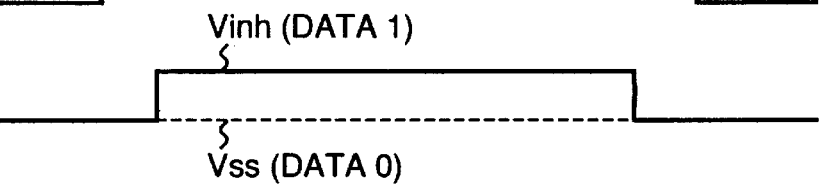
Fig.7C BL
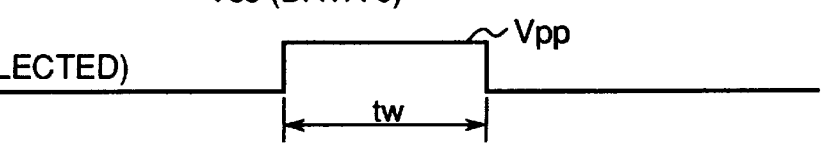
Fig.7D WL(SELECTED)

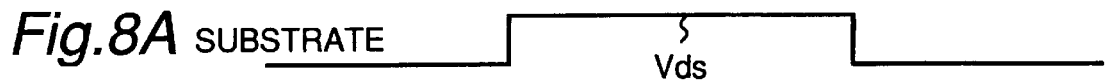
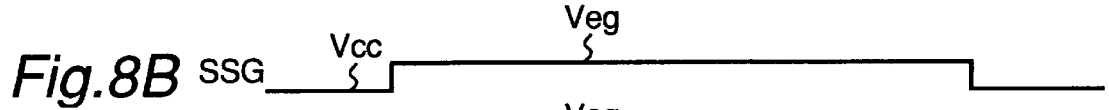
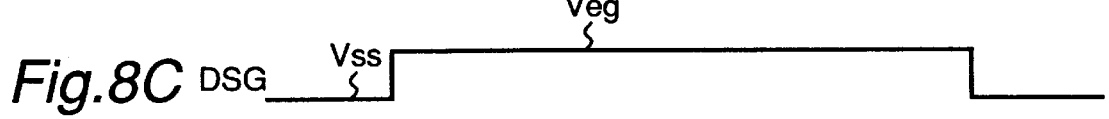
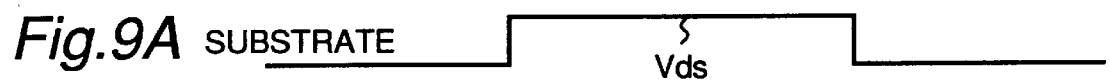
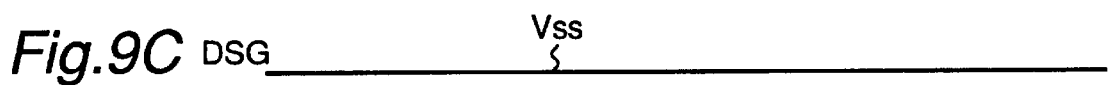
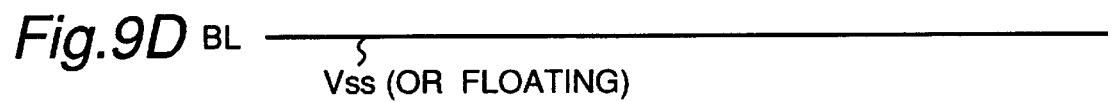
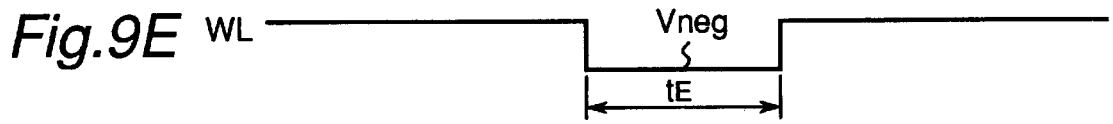

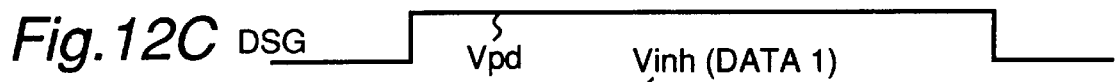
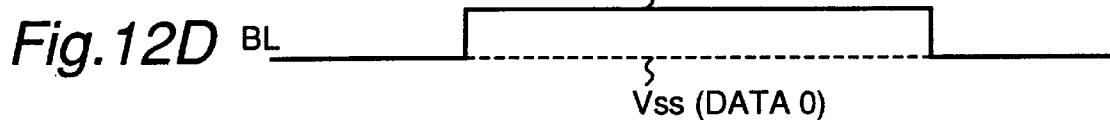
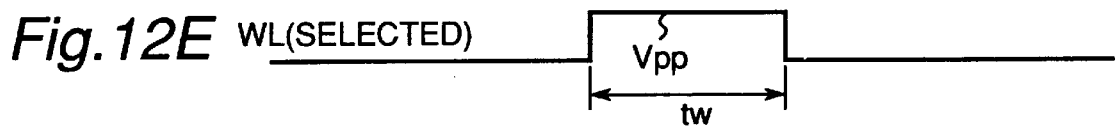
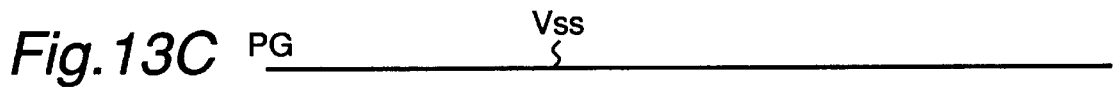
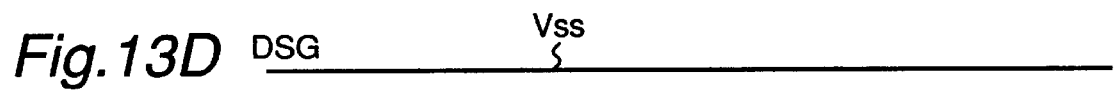
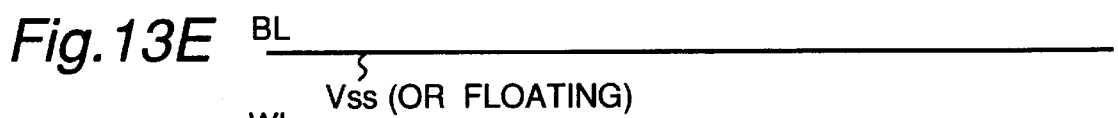
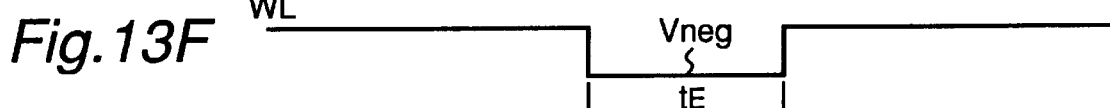
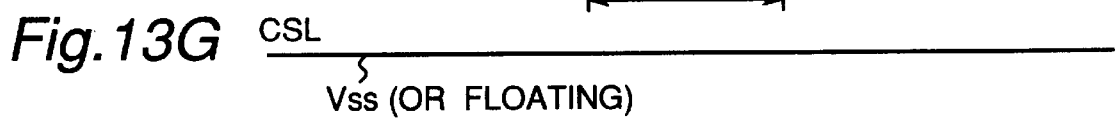

Fig.14
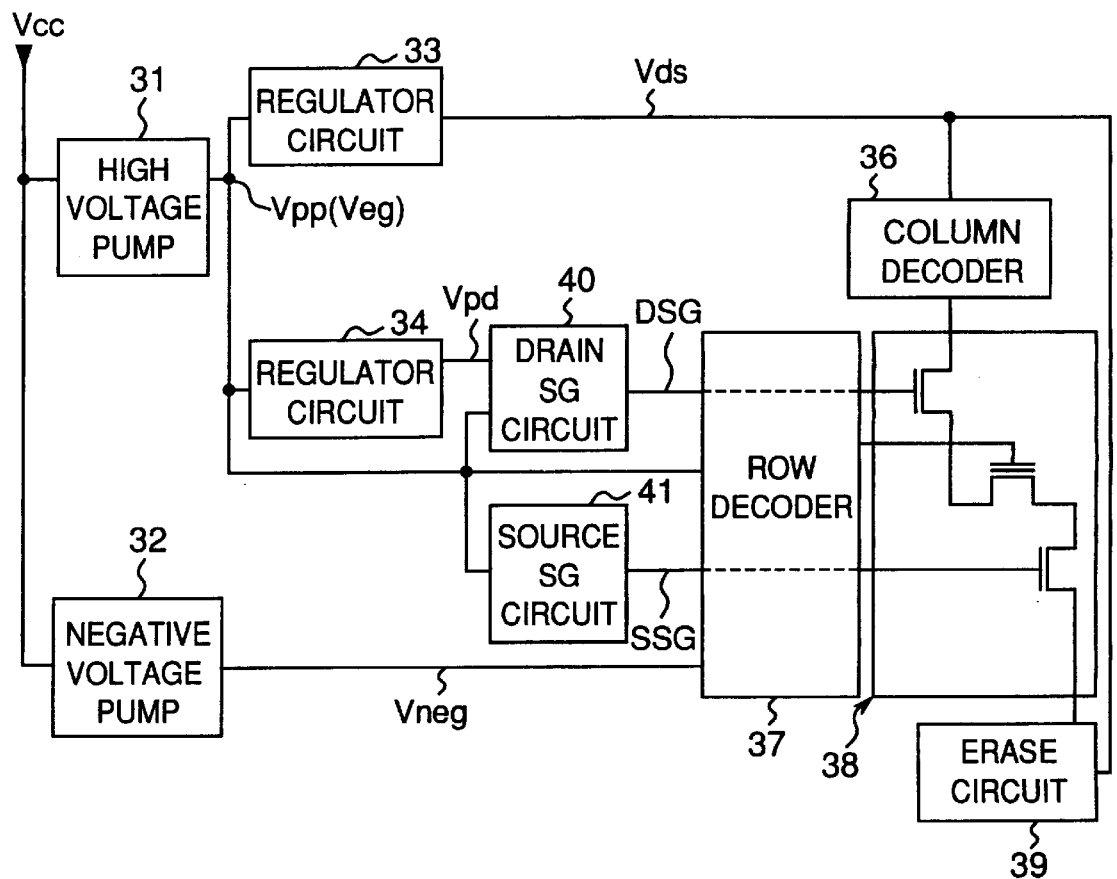
Fig.15A SSG
Fig.15B DSG
Fig.15C BL
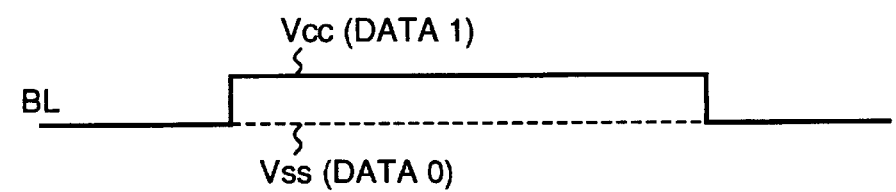
Fig.15D WL(SELECTED)
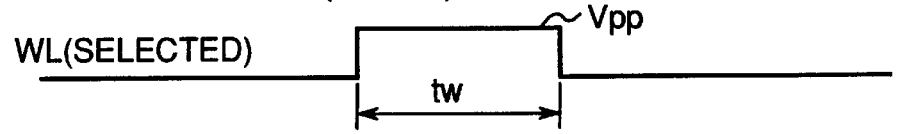

METHOD OF DRIVING A NONVOLATILE SEMICONDUCTOR STORAGE DEVICE

BACKGROUND OF THE INVENTION

The present invention relates to a method of driving a nonvolatile semiconductor storage device such as an electrically alterable flash memory.

Conventionally, a variety of flash memories having different memory cell structures and driven in different ways have been developed as nonvolatile semiconductor storage devices, by virtue of their capability of higher integration. These flash memories are classified into two groups depending on the following two program/erase driving methods:

(1) employing CHE (channel hot electron) injection for programming and employing FN (Fowler-Nordheim) tunneling for erasing; and (2) employing FN (Fowler-Nordheim) tunneling for both programming and erasing.

The method (1) is the most common method for flash memories, and particularly for ETOX (EEPROM with tunnel oxide) type flash memories. The memory cell structure (one-transistor type) of the ETOX type flash memory is shown in FIG. 16. This flash memory includes a source 52, a drain 53, a floating gate 55, a control gate 57, and a channel region between the source 52 and the drain 53. Also, an interlayer insulating film 56 is provided between the control gate 57 and the floating gate 55, and a tunnel oxide 54 is provided between the floating gate 55 and the channel region. An $n^-$ region 58 is formed between the source 52 and the semiconductor substrate 1, while a $p^+$ region 59 is formed between the drain 53 and the semiconductor substrate 1. The ETOX type flash memory is basically of the DDD (double doped drain) structure so that a high voltage is able to be applied. On the drain 53 side, there occur hot electrons at a high efficiency in the vicinity of the drain 53 due to the $p^+$ region 59. That is, the structure of the ETOX type flash memory is characterized by being asymmetric.

Table 1 shows applied voltage conditions of the memory cell of the ETOX type flash memory.

TABLE 1

|  | Gate | Drain | Source | Substrate |
|---|---|---|---|---|
| Program | 12 | 6 | 0 | 0 |
| Erase | −10 | F | 5 | 0 |
| Read | 5 | 1 | 0 | 0 |

Unit: V F: Floating

For programming of the memory cell in the ETOX type flash memory, channel hot electrons are generated in the vicinity of the drain 53 by using the applied voltage conditions shown in table 1, so that electrons are injected into the floating gate 55. For erasing, a high electric field is generated at a portion where the source 52 and the floating gate 55 overlap each other, by which the electrons are extracted from the floating gate 55 by the FN tunneling phenomenon.

FIG. 17 shows endurance characteristics of the ETOX type flash memory, indicating that the endurance characteristics deteriorate with repeated erase/program operations. That is, when the number of erase/program operations exceeds $10^3$, a threshold voltage Vth in the high threshold state (programming state) gradually decreases, while the threshold voltage Vth in the low threshold state (erase state) gradually increases. This is because electrons or holes are trapped in the tunnel oxide 54 during repeated erase/program operations.

FIG. 18 shows a memory cell array of NOR type structure in the ETOX type flash memory. The distribution of the threshold voltage Vth in the ETOX type flash memory, which is shown in FIG. 19, indicates that the erased state (with data "1") is a low threshold voltage Vth state and that the programmed state is a high threshold voltage Vth state.

First, in the case of a program sequence, the timing charts of which are shown in FIGS. 20A, 20B and 20C, a positive high voltage Vpp (e.g., +12 V) is applied to a word line WL with which a memory cell to be programmed is connected (FIG. 20A). In this case, for writing data "0", a positive high voltage Vpd (e.g., +6 V) is applied to a relevant bit line BL (FIG. 20B), and a voltage Vss (e.g., 0 V) is applied to a common source line CSL (FIG. 20C), so that very high energy electrons, i.e., channel hot electrons (CHE) are generated. With these high energy electrons injected to the floating gate, the threshold voltage Vth grows high. In this programming sequence, because a large current (0.5 mA/cell) flows through the channel region, the number of memory cells that can be programmed at the same time is limited to around 16.

In this connection, in a flash memory described later wherein both erase and program operations are performed by the Fowler-Nordheim (FN) tunneling, the current used for programming is 10 nA /cell or smaller so that memory cells of 1 K bits or more can be programmed at one time. In this case, in loading data "0", because the voltage Vss (e.g., 0 V) is applied to the bit line, there occur no channel hot electrons so that the threshold voltage Vth is held at the low state.

In the case of an erase sequence, on the other hand, the timing charts of which are shown in FIGS. 21A, 21B and 21C, a positive high voltage Vps (e.g., 5 V) is applied to the common source line CSL (FIG. 21C) and then a negative voltage Vnn (e.g., −10 V) is applied to the word line WL (FIG. 21A). When this is done, the voltage Vss (e.g., 0 V) is applied to the bit line BL (FIG. 21B). As a result, all the memory cells M00–Mnm have a high electric field generated at a portion where the source and the floating gate overlap each other, so that electrons are extracted from the floating gate to the source, with the result that the threshold voltage is lowered.

The flash memories employing the above method (2) are typified by the following five, which differ in structure of the memory cell array:

(a) AND Type Flash Memory;

(b) DI (Divided bit line) NOR Type Flash Memory;

(c) ACEE (Advanced Contactless EEPROM) Type Flash Memory;

(d) FN-FN Type Flash Memory With Select Gate; and (e) NAND Type Flash Memory

These (a) to (e) are explained below one by one.

(a) AND Type Flash Memory

An AND type flash memory has been reported in Technical Report of IEICE (THE INSTITUTE OF ELECTRONICS, INFORMATION AND COMMUNICATION ENGINEERS), ICD 93–128, pp. 37–43 (1993). A similar technique has also been reported in Japanese Patent Laid-Open Publication HEI 6-77437. This AND type flash memory has a basic structure of memory cells identical to that of the memory cell shown in FIG. 16, and the following description is made referring to this figure.

Table 2 shows applied voltage conditions of the AND type memory cell.

TABLE 2

|         | Gate | Drain | Source | Substrate |
|---------|------|-------|--------|-----------|
| Program | −9   | 4     | 0      | 0         |
| Erase   | 12   | F     | F      | 0         |
| Read    | 3    | 1     | 0      | 0         |

Unit: V, F: Floating

For programming the AND type memory cell, a high electric field is generated at a portion where the drain 53 and the floating gate 55 overlap each other, as obvious from the applied voltage conditions of Table 2, so that electrons are extracted from the floating gate 55 to the drain 53. For erasing, on the other hand, electrons are induced in the channel region between the source 52 and the drain 53, and a high electric field is generated between the channel region and the floating gate 55. As a result, electrons are injected to the floating gate 55 via the tunnel oxide 54.

(b) DINOR Type Flash Memory

The DINOR type flash memory has been reported in the IEEE Journal of Solid-State Circuits, Vol. 9., No. 4, pp. 454–459 (1994). This DINOR type flash memory also has a basic structure of memory cells identical to that shown in FIG. 16, and so the following description is made with reference to FIG. 16.

Table 3 shows applied voltage conditions of the DINOR type flash memory.

TABLE 3

|         | Gate | Drain | Source | Substrate |
|---------|------|-------|--------|-----------|
| Program | −8   | 5     | 0      | 0         |
| Erase   | 8    | F     | −8     | −8        |
| Read    | 3    | 1     | 0      | 0         |

Unit: V, F: Floating

For programming the DINOR type flash memory, as obvious from the applied voltage conditions of Table 3, a high electric field is generated at a portion where the drain 53 and the floating gate 55 overlap each other, so that electrons are extracted to the drain 53. For erasing, on the other hand, electrons are injected from the semiconductor substrate 51 and the source 52 to the floating gate 55 via the tunnel oxide 54.

FIG. 22 shows endurance characteristics of (a) the AND type flash memory and (b) the DINOR type flash memory. In the AND type flash memory and the DINOR type flash memory, both the erase characteristics and the programming characteristics deteriorate due to repeated erase/program operations as in the case of the ETOX type flash memory.

There is a report on a method of preventing such deterioration of endurance characteristics (IEICE TRANS. ELECTRON, VOL. E79–C, pp. 832–835, 1996). This report shows that in ejecting, or extracting the electrons from the floating gate 55 to reduce the threshold voltage of the memory cells, holes generated in the semiconductor substrate 51 are trapped in the tunnel oxide 54. These trapped holes, as is well known, largely affect the endurance characteristics of memory cells.

FIG. 23 shows endurance characteristics which have been improved by applying a negative electric field for ejection of electrons from the floating gate and then applying a positive electric field, wherein the negative electric field refers to an electric field generated when the voltage on the control gate 57 side in FIG. 16 is lower, and the positive electric field refers to an electric field generated when the voltage on the control gate 57 side is higher. It is considered that the holes trapped in the tunnel oxide 54 with the negative electric field applied may be electrically neutralized by the positive electric field applied, resulting in the improvement in the endurance characteristics. In the flash memories (c)–(e) described below, the endurance characteristics are improved by performing the injection/extraction of electrons in the same tunnel region.

(c) ACEE Type Flash Memory

The ACEE type flash memory uses the same region of the tunnel oxide (IEEE JOURNAL OF SOLID-STATE CIRCUITS Vol. 26, pp. 484–491, 1991).

FIG. 24 shows a basic structure of the memory cell of the ACEE type flash memory. This memory cell has a source 72, a drain 73, a tunnel oxide 74, an oxide 75, a gate oxide 76, a floating gate 77, an interlayer insulating 20 film 78, and a control gate 79, which are formed on a semiconductor substrate 71. The tunnel oxide 74 and the gate oxide 76 are insulated by the oxide 75, and electrons are injected into the floating gate 77 via the tunnel oxide 74, while electrons are extracted from the floating gate 77 via the tunnel oxide 74.

Table 4 shows applied voltage conditions of the memory cell of the above ACEE type flash memory in each operational mode.

TABLE 4

|         | Gate | Drain | Source | Substrate |
|---------|------|-------|--------|-----------|
| Program | 18   | 0     | 0      | 0         |
| Erase   | −11  | F     | 5      | 0         |
| Read    | 5    | 1     | 0      | 0         |

Unit: V, F: floating

For programming the ACEE type flash memory, with the control gate 79 at +18 V, with the drain 73 and the source 72 at 0 V, electrons are injected into the floating gate 77 via the tunnel oxide 74 on the source 72. For erasing, with the source 72 at +5 V and the control gate 79 at −11 V, electrons are extracted via the tunnel oxide 74.

As described above, in the ACEE type flash memory, the injection and extraction of electrons are performed via the same tunnel oxide 74 on the source 72. FIG. 25 shows endurance characteristics of the memory cell of this ACEE type flash memory, where the program/erase characteristics exhibit little change until after the erase/program cycle has been repeated $10^4$ times. This obviously indicates that the characteristics have been improved.

(d) FN—FN Flash Memory With Select Gate

The FN—FN flash memory with select gate has been discussed in Japanese Patent Laid-Open Publication HEI 6-120515. FIG. 26 shows a basic structure of a memory cell of the FN—FN flash memory with select gate. This memory cell has a source 82, a drain 83, a tunnel oxide 84, a floating gate 85, an interlayer insulating film 86, a control gate 87, and a select gate 88, which are formed on a semiconductor substrate 81.

Table 5 shows applied voltage conditions of the above FN—FN flash memory with select gate in each operational mode.

TABLE 5

|         | Gate | Drain | Source | Substrate | Select |
|---------|------|-------|--------|-----------|--------|
| Program | 18   | 0     | F      | 0         | 0      |
| Erase   | −9   | F     | F      | 9         | F      |
| Read    | 5    | 1     | 0      | 0         | 5      |

Unit: V, F: Floating

For programming the FN—FN flash memory with select gate, the channel region is induced under the floating gate 85, a high electric field is generated between the floating gate 85 and the channel region, and electrons are injected into the floating gate 85. For erasing, on the other hand, a high electric field is generated between the floating gate 85 and the semiconductor substrate 81. As a result, electrons are extracted (hole injection).

In the above FN—FN flash memory with select gate, the injection/extraction (hole injection) of electrons is performed via the same region of the tunnel oxide 84 between the channel region and the floating gate 85. Therefore, relatively good endurance characteristics can be obtained as shown in FIG. 26.

(e) NAND Type Flash Memory

The NAND type flash memory is the most common of the FN—FN flash memories. In this memory, a tunnel oxide between the channel region and the floating gate is used for programming/erasing. FIG. 28 shows the arrangement of a memory cell array of the NAND type flash memory, where memory cells Mxy are arrayed in a matrix form. Gates of the memory cells Mxy in an identical row are commonly connected with a word line WL0, . . . , WL15, while the sources and the drains of the memory cells Mxy in an identical column are connected to one another. The drains of the memory cells Mxy in the uppermost row in the figure are connected with bit lines BL0–BL2047 via respective select transistors ST. The sources of the memory cells Mxy in the lowermost row are commonly connected to a common source line SL.

Table 6 shows applied voltage conditions in each operational mode.

TABLE 6

|  | Gate | Drain | Source | Substrate |
| --- | --- | --- | --- | --- |
| Program | 21 | 0 | 0 | 0 |
| Erase | 0 | F | F | 23 |
| Read | 0 | 5 | 0 | 0 |

Unit: V, F: Floating

For programming the NAND type flash memory, as obvious from the applied voltage conditions of Table 6, electrons are induced in the channel region, and a high electric field is generated between the floating gate and the channel region, so that electrons are injected into the floating gate. For erasing, on the other hand, a high voltage is applied to the semiconductor substrate, so that a high electric field of a polarity opposite to that in the programming operation is generated. As a result, electrons are extracted from the floating gate. In the NAND type flash memory, relatively good endurance characteristics are obtained, as shown in FIG. 29

FIG. 30 shows a distribution of the threshold voltage of the memory cell in programming/erasing in the NAND type flash memory. For a read operation of the NAND type flash memory, a voltage of 0 V is applied to a word line connected with a memory cell to be read, while a voltage of +5 V is applied to word lines connected with non-selected memory cells.

In addition to the above types of (a) to (e), the flash memory using the FN tunneling for programming/erasing includes another type in which the source and drain are formed in a well layer (see Japanese Patent Laid-Open Publication HEI 8-279566). FIG. 31 shows a basic structure of a memory cell of such a flash memory in which a source and a drain are formed in a well layer. In this memory cell, an n-well layer 92 and a p-well layer 93 are formed on a semiconductor substrate 91, and a source 94 and a drain 95 are formed in the p-well layer 93. On the p-well layer 93, source 94 and drain 95 are formed a tunnel oxide 96, a floating gate 97, an interlayer insulating film 98 and a control gate 99.

Table 7 shows applied voltage conditions for each mode of the flash memory in which the source and the drain are formed in the well layer.

TABLE 7

|  | Gate | Drain | Source | Well |
| --- | --- | --- | --- | --- |
| Program | 12 | *−3/3 | F | −3 |
| Erase | −9 | 6 | F | 6 |
| Read | 3 | 1 | 0 | 0 |

*for data 0/for data 1
Unit: V, F: Floating

In this flash memory, for programming, as shown in Table 7, the p-well layer 93 is biased to a negative voltage, while the drain 95 has a negative voltage applied thereto. This flash memory can be operated with a memory cell array arrangement similar to that shown in FIG. 3. In programming, a voltage of −3 V or +3 V is applied to the drain in accordance with data of "0" or "1". With −3 V applied to the drain 95, a high electric field is generated across the channel region and the floating gate between the source 94 and the drain 95, so that electrons are injected into the floating gate. With +3 V applied to the drain, the electric field is relaxed so that electrons are not injected to the floating gate.

In the ETOX type, AND type, and DINOR type flash memories that have been described hereinabove, the region of the tunnel oxide through which electrons are passed differs between the programming operation and the erasing operation, thus having a problem of large deterioration of endurance characteristics. Further, in these devices, because high voltages are applied to the drain and the source for the extraction of electrons, a tunneling (Band-to-Band) current flows accordingly, so that hot holes are generated. These hole holes are trapped by the tunnel oxide, causing the endurance characteristics to be deteriorated.

Also, a high voltage must be applied to the drain or the source for enhancement of the efficiency of electron extraction. However, in order for a punch through effect not to occur, such parts must be formed in a large area to ensure the resistance to high voltage. This would result in a problem of increased layout area.

On the other hand, the ACEE type flash memory and the FN—FN flash memory with select gate use the same region of the tunnel oxide for both programming and erasing, so that the endurance characteristics are improved. However, as can be understood from the basic structure of the memory cells shown in FIGS. 24 and 26, the effective area per memory cell is comparatively large (about 1.5 to 3 times that of the ETOX type), which would obstruct the higher degree of integration of flash memories.

Also, in the NAND type flash memory, which is superior in terms of high integration and endurance characteristics, as can be understood from the arrangement of its memory cell array, data is output to a bit line via channel regions of non-selected memory cells up to a memory cell to be read. Accordingly, resistors and capacities connected with the bit line increase, causing the access speed to be considerably reduced. For example, the NOR type flash memory has an access time of around 100 ns, while the NAND type flash memory has that of around 10 µs, which is about 100 times longer. That is, the NAND type flash memory is incapable of offering a high access speed. Further, the investigation of the operating region (a region where electrons pass) of the NAND type flash memory indicates that programming is done by electrons being injected from the source, drain and channel layers. Erasing, on the other hand, is done by electrons being extracted from the floating gate substantially only into the channel region because the source and drain are in the floating state. That is, between the drain/source and the floating gate, only the electron injection is done, and electrons remain trapped at this part (i.e. in the oxide on the source and drain). This could affect the endurance characteristics and reliability if erase/program operations are repeated as many as more than one million times.

Further, in the flash memory in which the source and the drain are formed in the well layer, there are formed several M (=$10^6$) of memory cells. Since a negative voltage is applied to the p-well layer 93 during programming, a capacity of several thousand pf is added to the p-well layer 93, causing the rise of signals to be much slow, resulting in an access speed for programming being considerably lowered. Furthermore, since a positive voltage and a negative voltage are selectively applied to the bit lines, it is necessary to form on a triple well a data latch circuit or the like for selecting voltages to be applied to the bit lines. This would result in increase in the layout area.

SUMMARY OF THE INVENTION

Therefore, an object of the present invention is to provide a method of driving nonvolatile semiconductor storage devices which method is capable of realizing a higher access speed and a higher degree of integration and which method allows the erase/programming endurance characteristics to be improved.

According to an aspect of the present invention, there is provided a method of driving a nonvolatile semiconductor storage device wherein said nonvolatile semiconductor storage device comprises a memory cell array in which memory cells, each comprised of a floating gate type MOS transistor, are arrayed in a matrix form, each memory cell having a source and a drain formed on a semiconductor substrate and spaced from each other, a tunnel oxide formed on the source and drain and on a channel region disposed between the source and the drain, a floating gate formed on the tunnel oxide, an interlayer insulating film formed on the floating gate, and a control gate formed on the interlayer insulating film, and the nonvolatile semiconductor storage device further comprises word lines each connected with the control gates of the memory cells in respective rows, local bit lines each connected with the drains of the memory cells in respective columns, main bit lines connected with the corresponding local bit lines via respective first MOS transistors, local source lines each connected with the sources of the memory cells in respective columns, and a common source line connected with the local source lines via respective second MOS transistors.

With the method of driving a nonvolatile semiconductor storage device according to an aspect of the present invention, in injecting electrons into the floating gate of a memory cell for programming thereof, a first voltage is applied to the drain of the memory cell via the corresponding main bit line, the corresponding first MOS transistor, and the corresponding local bit line. Also, a second voltage is applied to the control gate of the memory cell via the corresponding word line. Then, electrons are induced in the channel region between the drain and the source, making the drain and the source short-circuited. Thus, the first voltage is applied via the drain to the channel region between the drain and the source as well as to the source, so that a high electric field is generated between the drain and the floating gate of the memory cell, between the source and the floating gate and between the channel region and the floating gate. Consequently, the electrons are injected into the floating gate from the drain, source and channel region of the memory cell via the tunnel oxide thereof.

On the other hand, in an erasing operation, a third voltage is applied to the semiconductor substrate while a fourth voltage is applied to the control gate of a memory cell to be erased via the corresponding word line. Thus, there is generated a high electric field of a polarity opposite to that in the injection of electrons, whereby electrons are extracted from the floating gate to the channel region between the drain and the source of the memory cell via the tunnel oxide.

In this way, the injection/extraction of electrons is performed via the tunnel oxide of an identical region, and positive and negative electric fields are applied to the tunnel oxide, by which the erase/program endurance characteristics are prevented from deteriorating. If such an erasing/ programming method is applied to a nonvolatile semiconductor storage device such as a NOR type flash memory, higher access speed and higher integration are achievable and moreover, endurance characteristics for erasing/ programming are improved.

In an embodiment, the first voltage is a reference potential and the second voltage is a positive voltage. Also, the third voltage is a positive voltage and the fourth voltage is a negative voltage. In this case, in injecting electrons into the floating gate of a memory cell for programming thereof, the source, drain and channel region become the reference potential and the control gate becomes the positive voltage, so that an electric field in which the floating gate side is higher in potential, is generated between the drain and the floating gate, between the source and the floating gate, and between the channel region and the floating gate. For erasing, on the other hand, the semiconductor substrate becomes the positive voltage and the control gate becomes the negative voltage, so that an electric field with the floating gate side lower in potential is generated between the channel region and the floating gate. Thus, positive and negative electric fields are applied to the tunnel oxide on the channel region for the injection/extraction of electrons.

In an embodiment, the method utilizes Fowler-Nordheim tunneling for the injection of electrons into the floating gate of the memory cell and the extraction of electrons from the floating gate. In this case, current to be used for programming is extremely smaller than when electrons are injected into the floating gate by channel hot electrons. Thus, many memory cells can be programmed simultaneously, and yet the current consumption is reduced.

In an embodiment, in extracting the electrons from the floating gate of the memory cell, the third voltage is also applied both to the drain of the memory cell via the main bit line, first MOS transistor and local bit line and to the source of the memory cell via the common source line, the second MOS transistor and the local source line. Then, a high electric field of a polarity opposite to that for injection of electrons is generated not only between the channel region and the floating gate, but also between the drain and the floating gate and between the source and the floating gate. Therefore, electrons are ejected or extracted from the floating gate to the drain, source and channel region of the memory cell via the tunnel oxide. That is, the both injection and the extraction of electrons are performed via the tunnel oxide on the source, drain and channel region. Thus, the endurance characteristics can be well improved.

Alternatively, the first and second MOS transistors may be turned off when extracting the electrons from the floating gate of the memory cell, so that both the drain and the source of the memory cell are placed in a floating state. In this case, a high electric field of a polarity opposite to that for injection of electrons is generated only between the channel region and the floating gate, so that the extraction of electrons is performed via the tunnel oxide on the channel region only. In this case, however, advantageously, there is no need of generating high electric voltages for turning on the first and second MOS transistors, so that a device to generate a high electric voltage can be provided in a small layout area.

In an embodiment, when not injecting electrons into the floating gate of a memory cell for programming, a fifth voltage is applied to the drain of the memory cell via the corresponding main bit line, the corresponding first MOS transistor, and the corresponding local bit line. Also, the second voltage is applied to the control gate of the memory cell via the corresponding word line. Then, electrons are induced in the channel region between the drain and the source, making the drain and the source short-circuited, so that the fifth voltage is applied via the drain to the channel region and to the source. At this time, the channel region may be boosted due to the coupling of the channel region with the control gate to become higher. Thus, the electric field between the channel region and the floating gate is relaxed, which prevents electrons from being injected into the floating gate.

In an embodiment, the first voltage is a reference voltage and the second voltage is a positive voltage. The third voltage is a positive voltage and the fourth voltage is a negative voltage. Also, the fifth voltage is a positive voltage higher than the reference voltage.

In an embodiment, the nonvolatile semiconductor storage device for which the driving method of the present invention is used, is also provided with third MOS transistors for connecting the local bit lines with the respective local source lines. In this case, when not injecting electrons into the floating gate of the memory cell for programming, the source and the drain are short-circuited by turning on the third MOS transistor, so that the source and the drain will have the same potential immediately. Thus, there occurs no current flow between the source and the drain. Accordingly, channel hot electrons are prevented from occurring, and deterioration of endurance characteristics is suppressed.

The present invention also provides a method of driving a nonvolatile semiconductor storage device, wherein said nonvolatile semiconductor storage device comprises a memory cell array in which memory cells, each comprised of a floating gate type MOS transistor, are arrayed in a matrix form, each memory cell having a source and a drain formed on a semiconductor substrate and spaced from each other, a tunnel oxide formed on the source and drain and on a channel region disposed between the source and the drain, a floating gate formed on the tunnel oxide, an interlayer insulating film formed on the floating gate, and a control gate formed on the interlayer insulating film, and said nonvolatile semiconductor storage device further comprises word lines each connected with the control gates of the memory cells in respective rows, local bit lines each connected with the drains of the memory cells in respective columns, main bit lines connected with the corresponding local bit lines via respective first MOS transistors, local source lines each connected with the sources of the memory cells in respective columns, and a common source line connected with the local source lines via respective second MOS transistors, said method characterized in that:

in programming a memory cell, the corresponding second MOS transistor is turned off to disconnect the local source line connected with the memory cell from the common source line, the first MOS transistor is turned on to connect the local bit line connected with the memory cell with the corresponding main bit line, and a specified voltage is applied to the corresponding main bit line and a predetermined voltage is applied to the word line connected with the memory cell such that the specified voltage on the main bit line is applied to the drain of the memory cell and then to the channel region and source thereof.

Furthermore, the present invention provides a method of driving a nonvolatile semiconductor storage device, wherein said nonvolatile semiconductor storage device comprises a memory cell array in which memory cells, each comprised of a floating gate type MOS transistor, are arrayed in a matrix form, each memory cell having a source and a drain formed on a semiconductor substrate and spaced from each other, a tunnel oxide formed on the source and drain and on a channel region disposed between the source and the drain, a floating gate formed on the tunnel oxide, an interlayer insulating film formed on the floating gate, and a control gate formed on the interlayer insulating film, and said nonvolatile semiconductor storage device further comprises word lines each connected with the control gates of the memory cells in respective rows, local bit lines each connected with the drains of the memory cells in respective columns, main bit lines connected with the corresponding local bit lines via respective first MOS transistors, local source lines each connected with the sources of the memory cells in respective columns, a common source line connected with the local source lines via respective second MOS transistors, and third MOS transistors for connecting the local bit lines with the respective local source lines, said method comprising:

(a) in an programming operation,
disconnecting the local source line connected with a memory cell to be programmed from the common source line by turning off the corresponding second MOS transistor so as to place the source of the memory cell in a floating state;
connecting the local bit line with the corresponding main bit line by turning on the corresponding first MOS transistor;
connecting the local bit line also with the local source line now disconnected from the common source line by turning on the corresponding third MOS transistor; and
(i) in case of injecting electrons into the floating gate of the memory cell,
applying a first voltage to the drain and source of the memory cell via the corresponding main bit line, local bit line and local source line connected with one another by the first and third MOS transistors turned on, and applying a second voltage to the control gate of the memory cell via the corresponding word line to thereby apply the first voltage to the channel region of the memory cell, so that electrons are injected into the floating gate of the memory cell from the drain, the source and the channel region of the memory cell via the tunnel oxide,
(ii) in case of not injecting electrons into the floating gate of the memory cell,
applying a write inhibit voltage to the drain and source of the memory cell via the corresponding main bit line, local bit line and local source line connected with one another by the first and third MOS transistors turned on, and applying the second voltage to the control gate of the memory cell via the corresponding word line to thereby apply the write prohibit voltage to the channel region of the memory cell so that electrons are not injected into the floating gate of the memory cell; and (b) in an erasing operation,
applying a third voltage to the semiconductor substrate while applying a fourth voltage to the control gate of a memory cell to be erased via the corresponding word line so that electrons are extracted from the floating gate to the channel region of the memory cell via the tunnel oxide.

Other objects, features, and advantages of the present invention will be apparent from the accompanying drawings and from the detailed description that follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 6 is a graph schematically showing threshold voltage distributions of memory cells of the nonvolatile semiconductor storage device in the erased and programmed states;

FIGS. 7A, 7B, 7C and 7D are timing charts showing a programming sequence of the nonvolatile semiconductor storage device;

FIGS. 8A, 8B, 8C, 8D and 8E are timing charts showing an erase sequence of the nonvolatile semiconductor storage device;

FIGS. 9A, 9B, 9C, 9D, 9E and 9F are timing charts showing another erase sequence of the nonvolatile semiconductor storage device;

FIGS. 12A, 12B, 12C, 12D and 12E are timing charts showing a programming sequence of the nonvolatile semiconductor storage device;

FIGS. 13A, 13B, 13C, 13D, 13E, 13F and 13G are timing charts showing an erase sequence of the nonvolatile semiconductor storage device;

FIG. 14 is a schematic block diagram of a nonvolatile semiconductor storage device according to a third embodiment of the present invention;

FIGS. 15A, 15B, 15C and 15D are timing charts showing a programming sequence of the nonvolatile semiconductor storage device;

DETAILED DESCRIPTION OF THE PREFERRED EMBODIMENTS

Hereinbelow, the method for driving a nonvolatile semiconductor storage device according to the present invention is described in more detail with reference to embodiments thereof illustrated in the accompanying drawings.

First Embodiment

Figure 1:
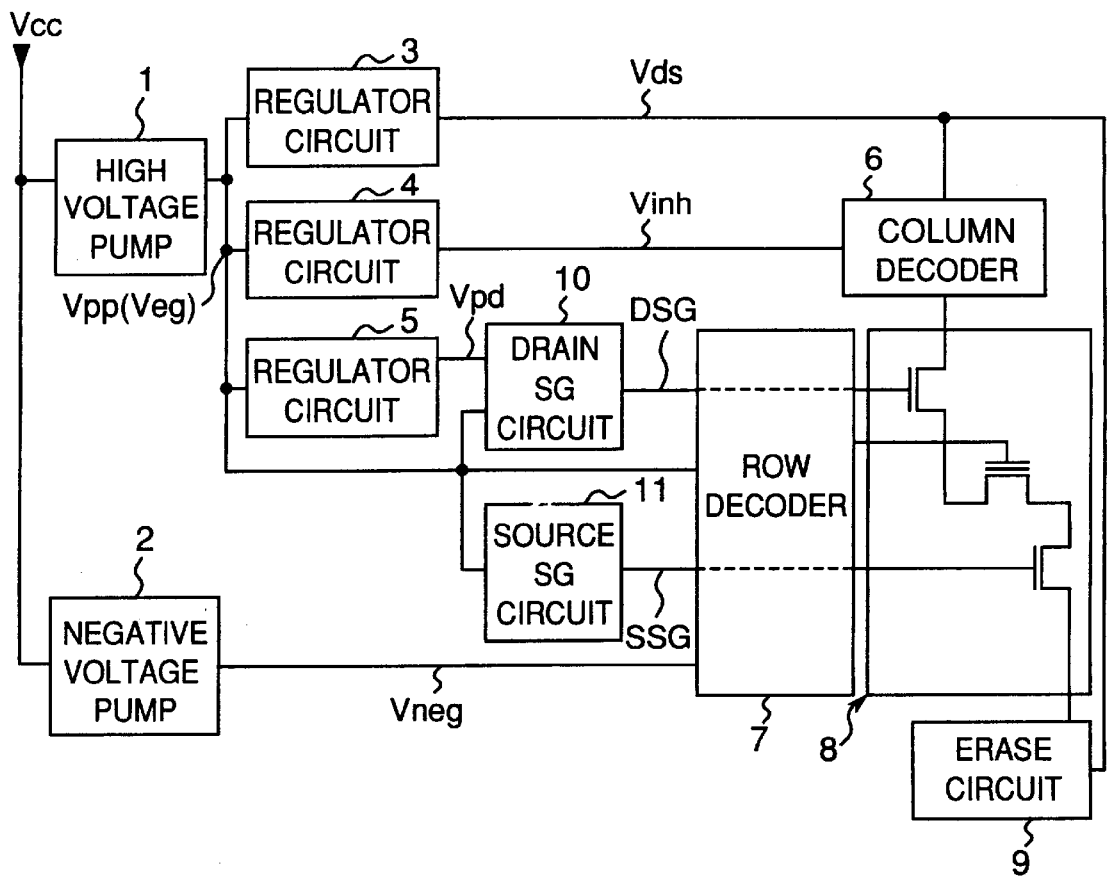
FIG. 1 is a schematic block diagram of a nonvolatile semiconductor storage device according to a first embodiment of the present invention.
Figure 16:
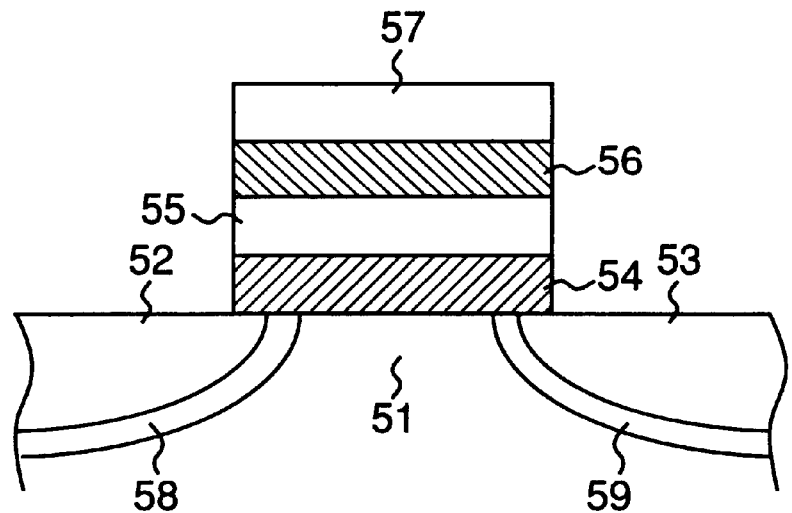
FIG. 16 is a sectional view showing the basic structure of the prior art ETOX type flash memory cell.
Figure 17:
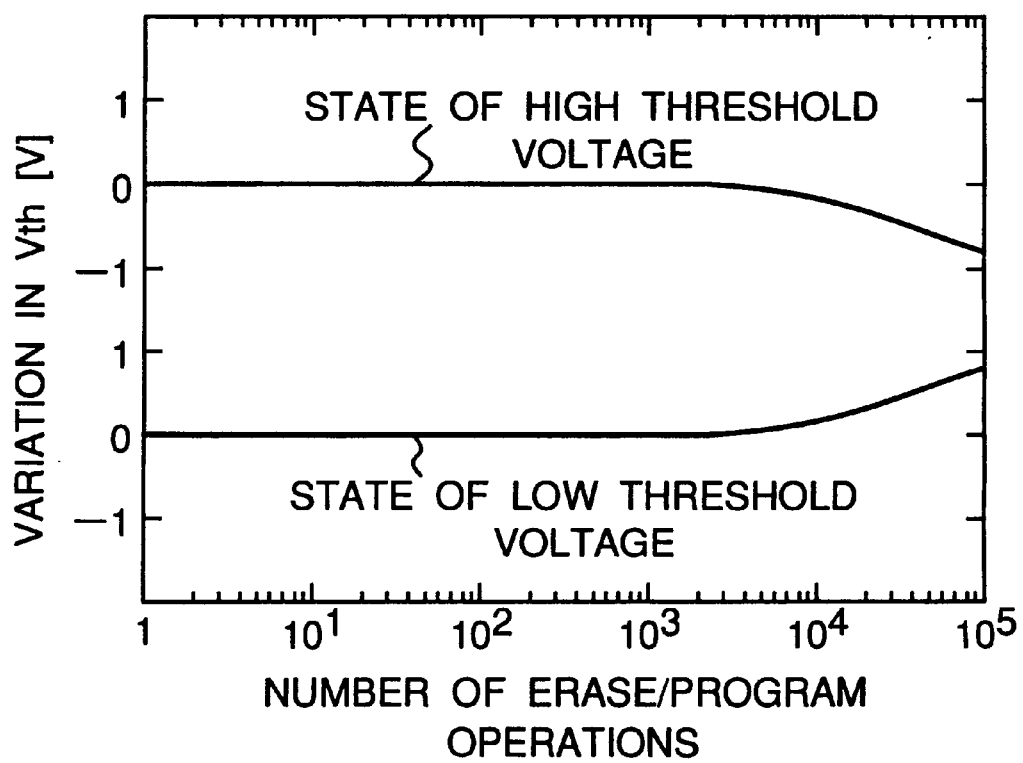
FIG. 17 is a diagram showing endurance characteristics of the ETOX type flash memory.
Figure 18:
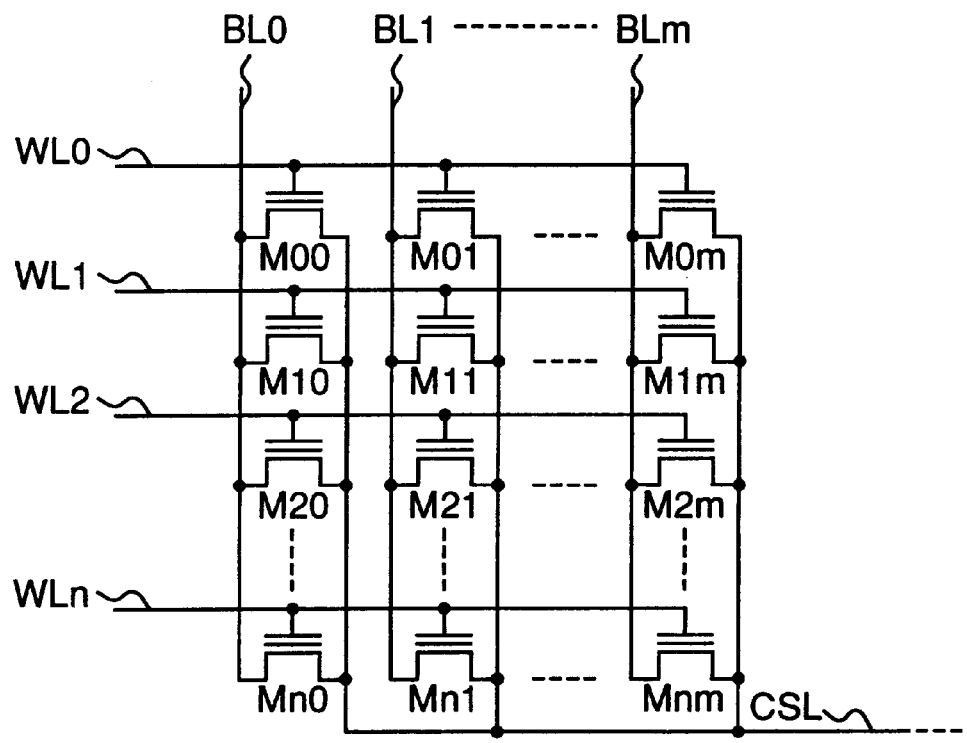
FIG. 18 is a circuit diagram showing the structure of the NAND type memory cell array.
Figure 19:
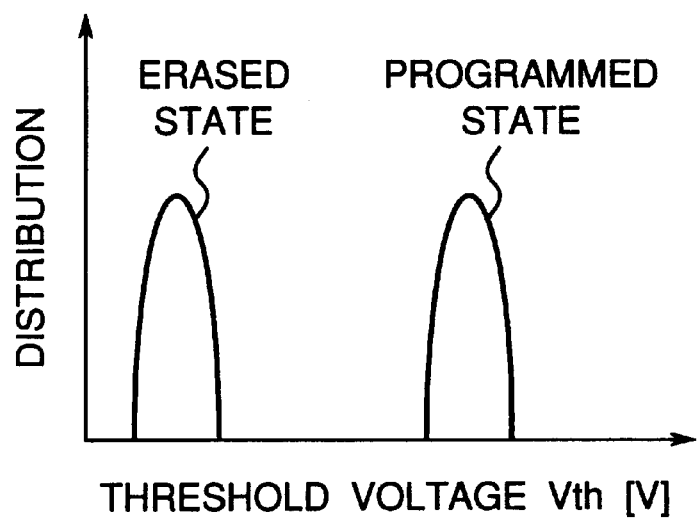
FIG. 19 is a diagram showing the threshold voltage distributions of the memory cell in the NAND type memory cell array in the erase and programming states.
Figure 20A:
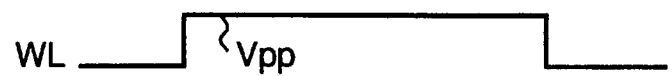
FIGS. 20A, 20B and 20C are timing charts showing a programming sequence of the ETOX type flash memory.
Figure 20B:
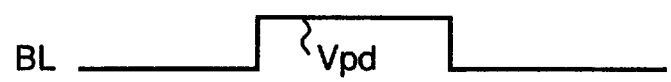
Figure 20C:
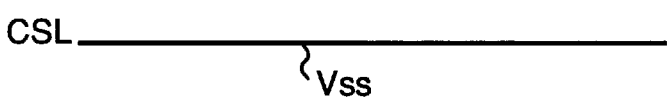
Figure 21A:
FIGS. 21A, 21B and 21C are timing charts showing an erase sequence of the ETOX type flash memory.
Figure 21B:
Figure 21C:
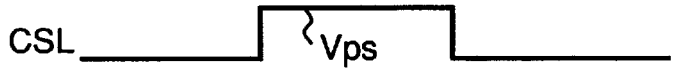
Figure 22:
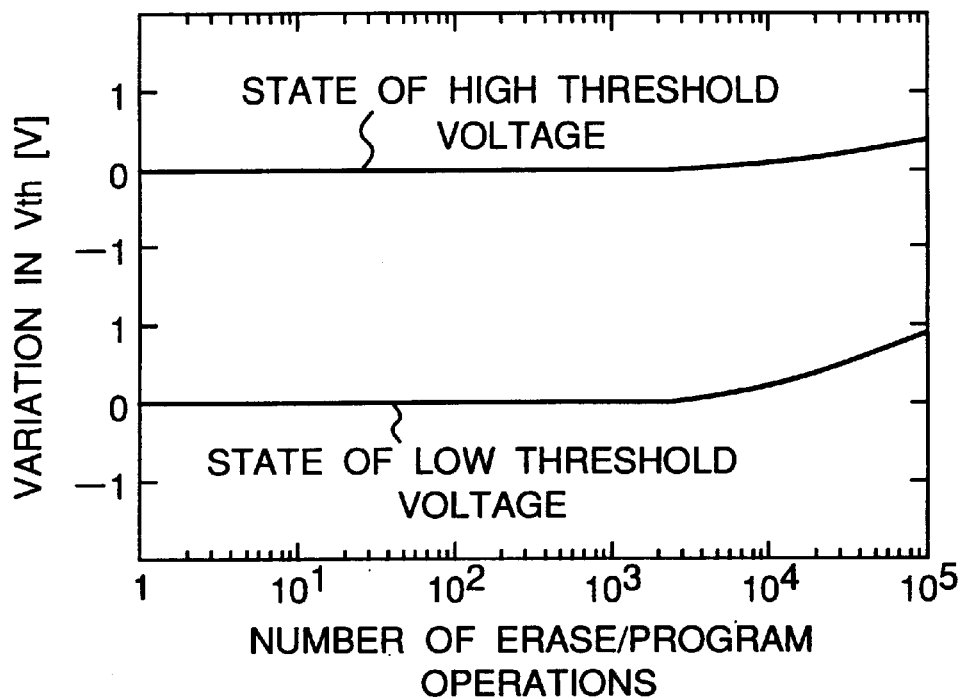
FIG. 22 is a diagram showing the endurance characteristics of the AND type and DINOR type flash memories.

FIG. 1 is a schematic block diagram of a NOR type flash memory as a nonvolatile semiconductor storage device according to a first embodiment of the present invention. It is noted that the memory cells of this flash memory has substantially the same basic structure as the memory cell shown in FIG. 16.

As shown in FIG. 1, the flash memory includes a high voltage pump (high voltage generation circuit) 1 which, receiving a voltage Vcc, supplies a boosted positive voltage Vpp (Veg) as the second voltage, and a negative voltage pump (negative voltage generation circuit) 2 which, receiving the voltage Vcc, supplies a boosted negative voltage Vneg as the fourth voltage. The flash memory also includes a regulator circuit 3 which, receiving the positive voltage Vpp from the high voltage pump 1, supplies a voltage Vds as the third voltage, a regulator circuit 4 which, receiving the positive voltage Vpp from the high voltage pump 1, supplies a voltage Vinh, and a regulator circuit 5 which, receiving the positive voltage Vpp from the high voltage pump 1, supplies a voltage Vpd. Also, the flash memory has a column decoder 6 which, upon receipt of the voltage Vds from the regulator circuit 3 and the voltage Vinh from the regulator circuit 4, selects a bit line, a row decoder 7 which, upon receipt of the positive voltage Vpp from the high voltage pump 1, selects a word line, a memory cell array 8 in which a plurality of memory cells (only one of which is shown in FIG. 1) are arrayed in a matrix shape, an erase circuit 9 which, upon receipt of the voltage Vds from the regulator circuit 3, executes the erasing of the memory cells, a drain sg (select gate) circuit 10 which, upon receipt of the positive voltage Vpp from the high voltage pump 1 and the voltage Vpd from the regulator circuit 5, supplies a signal to a drain select gate signal line DSG, and a source sg (select gate) circuit 11 which, upon receipt of the positive voltage Vpp from the high voltage pump 1, supplies a signal to a source select gate signal line SSG.

Figure 2:
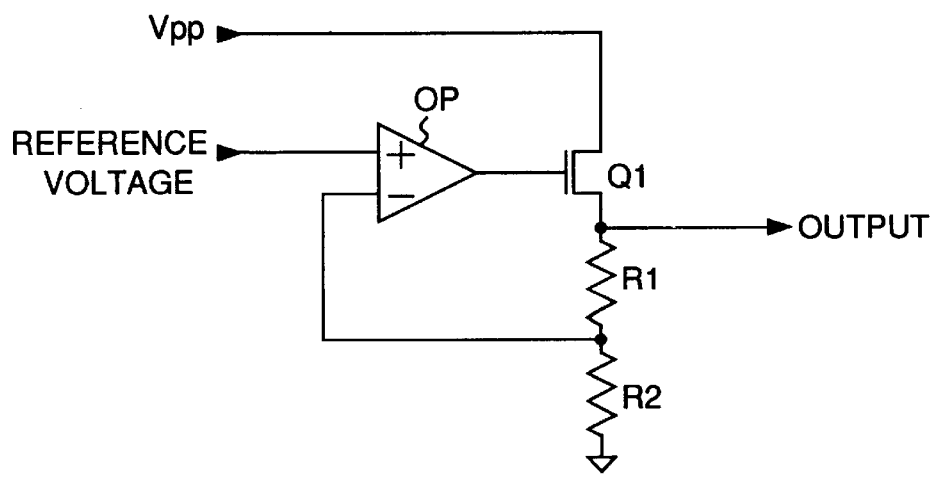
FIG. 2 is a circuit diagram of a regulator circuit of the nonvolatile semiconductor storage device.

Also, FIG. 2 shows a circuit diagram of the regulator circuits 3, 4, 5. Each of the regulator circuits 3, 4, 5 has an inverting amplifier OP with its noninverting input terminal receiving a reference voltage, a transistor Q1 whose gate is connected to an output terminal of the inverting amplifier OP and whose drain is supplied with the voltage Vpp, a resistor R1 whose first end is connected to the source of the transistor Q1 and whose second end is connected to the inverting input terminal of the inverting amplifier OP, and a resistor R2 connected between the second end of the resistor R1 and the ground. The voltage Vds, Vinh, or Vpd is output from the source of the transistor Q1.

In the flash memory of this arrangement, voltages necessary for programming/erasing are obtained using the high voltage pump 1, the negative voltage pump 2 and the regulator circuits 3, 4, and 5. The high voltage pump 1 generates the voltage Vpp at the time of programming, and generates the voltage Veg at the time of erasing. Further, the negative voltage pump 2 does not operate during the programming operation that does not use the negative voltage, and generates the voltage Vneg at the time of erasing.

Table 8 shows applied voltage conditions for each operation of the flash memory.

TABLE 8

|  | Gate | Drain | Source | Substrate |
|---|---|---|---|---|
| Program | Vpp | *Vss/Vinh | *Vss/Vinh | Vss |
| Erase | Vneg | Vds(F) | Vds(F) | Vds |
| Read | Vcc | Vbias | Vss | Vss |

*For data 0/For data 1
Unit: V, F: Floating

Figure 4:
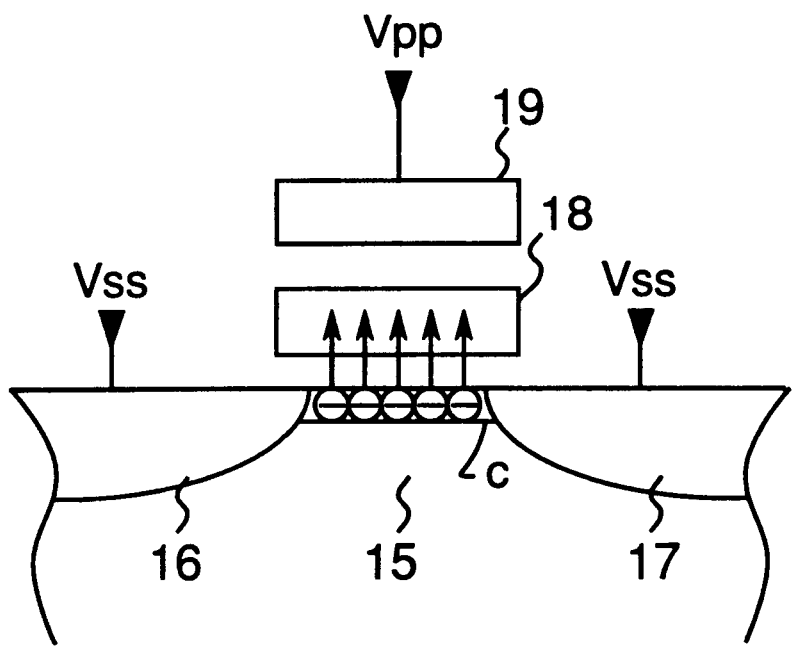
FIG. 4 is a sectional view of a memory cell for explanation of electron injection into a floating gate of the nonvolatile semiconductor storage device.

FIG. 4 shows a cross section of a memory cell of the flash memory. This memory cell is a floating gate type MOS transistor (MOS type field effect transistor) having a source 16 and a drain 17 formed, spaced from each other, on a semiconductor substrate 15. The transistor also has a floating gate 18 formed on the source 16 and drain 17 and on a channel region C between the source 16 and the drain 17 via a tunnel oxide (not shown), and a control gate 19 formed on the floating gate 18 via an interlayer insulating film (not shown).

For programming the flash memory to data 0, the voltage Vpp (control gate voltage for programming, e.g., +15 V) is applied to the control gate 19, and the voltage Vss (reference potential) as the first voltage is applied to the source 16 and the drain 17. This gives rise to electrons in the channel region C so that a high electric field is generated between the floating gate 18 and the channel region C. As a result, the electrons are injected into the floating gate 18 via the tunnel oxide (not shown).

Figure 5:
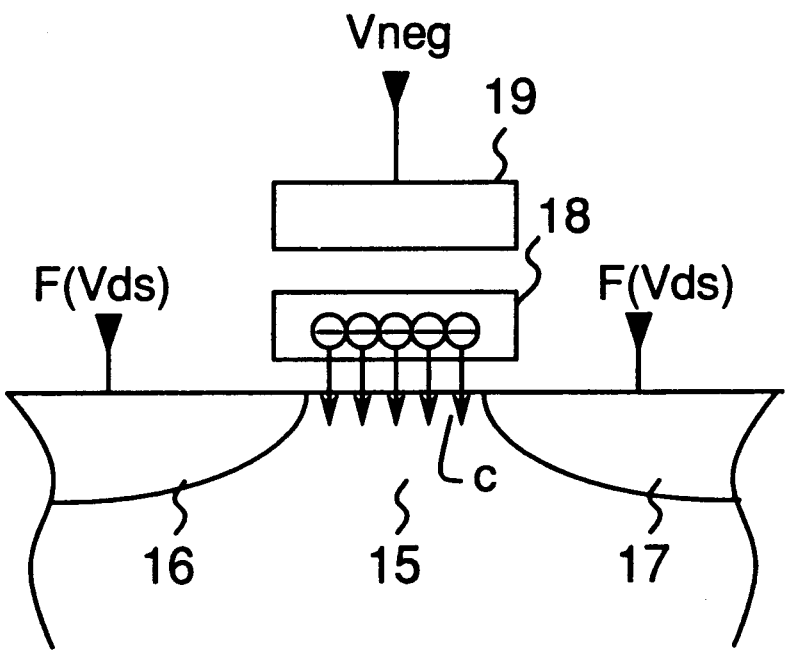
FIG. 5 is a sectional view of a memory cell for explanation of electron extraction from the floating gate of the nonvolatile semiconductor storage device.

For erasing, on the other hand, as shown in FIG. 5, the voltage Vneg (control gate negative voltage for erasing, e.g., −10 V) is applied to the control gate 19, while the source 16 and the drain 17 are placed in a floating state. Alternatively, the voltage Vds (e.g., 0 V to +6 V) is applied to the source 16 and the drain. Also the voltage Vds is applied to the semiconductor substrate 15. As a result, electrons are extracted from the floating gate 18 toward the channel region C via the tunnel oxide.

FIG. 6 shows a threshold voltage distribution in the erase and program states of the memory cells, wherein the horizontal axis represents the threshold voltage Vth, while the vertical axis represents the distribution which is indicated in terms of the number of memory cells.

Figure 3:
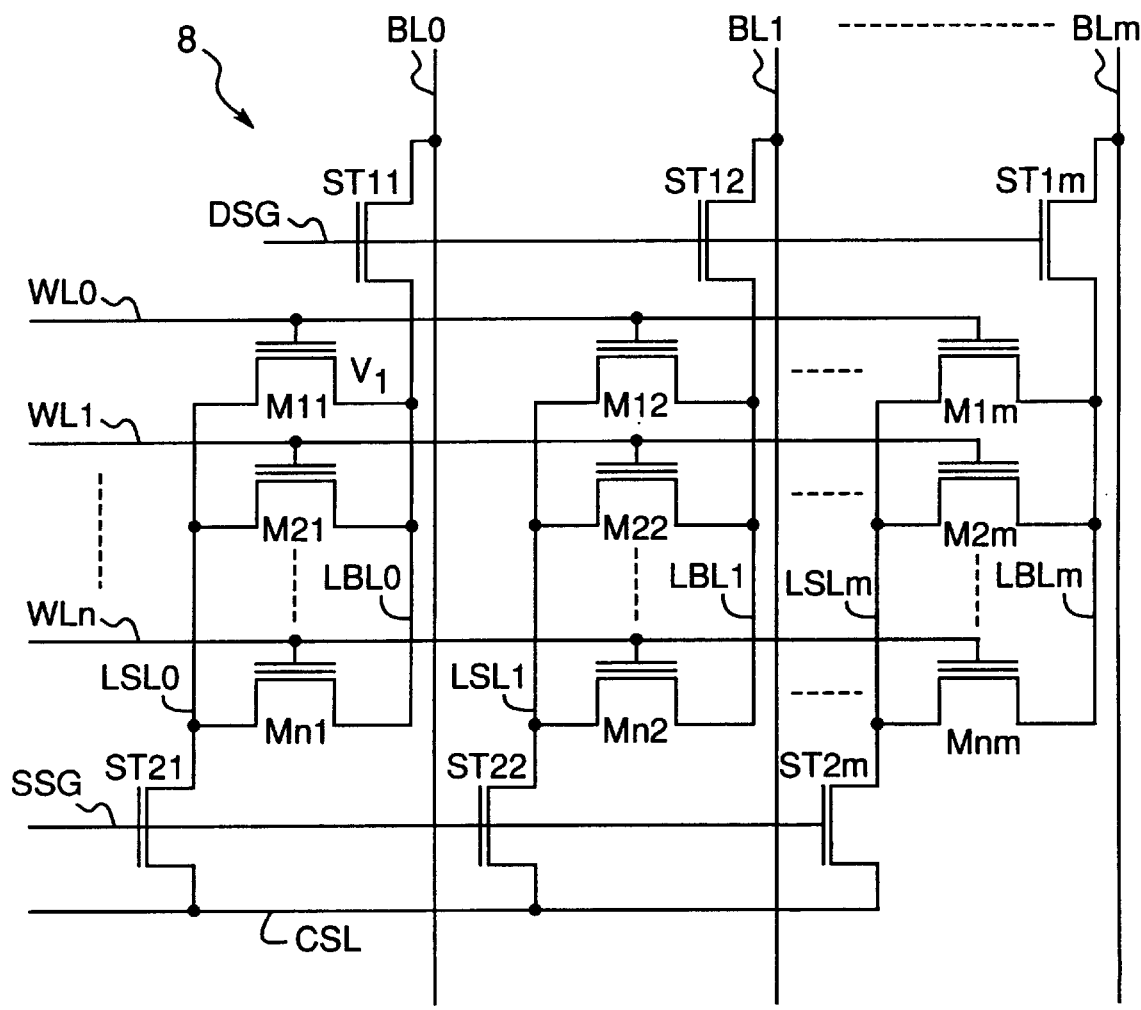
FIG. 3 is a circuit diagram of a memory cell array of the nonvolatile semiconductor storage device.

FIG. 3 shows an arrangement of the memory cell array 8 shown in FIG. 1. In this memory cell array 8, local bit lines LBL0–LBLm each are connected with the drains in a same column of the memory cells M11–Mnm, and are also connected to respective main bit lines BL0–BLm via select transistors ST11–ST1m serving as the first MOS transistors, respectively. Also, local source lines LSL0–LSLm each are connected with the sources in a same column of the memory cells M11–Mnm, and all of the local source lines are connected to a common source line CSL via select transistors ST21–ST2m serving as the second MOS transistors, respectively. Further, control gates in a same row of the memory cells M11–Mnm are connected to a corresponding word line WL0–WLn in common. The drain select gate signal line DSG is connected to each gate of the select transistors ST11–ST1m, while the source select gate signal line SSG is connected to each gate of the select transistors ST21–ST2m.

Table 9 shows applied voltage conditions in each operation of the memory cell array 8.

TABLE 9

|  | Program | Erase | Read |
|---|---|---|---|
| WL (select) | Vpp | Vneg | Vcc |
| WL (nonselect) | Vss | — | Vss |
| BL (data 0) | Vss | Vds(F) | Vbias |
| BL (data 1) | Vinh | — | — |
| DSG | Vpd | Veg | Vcc |
| SSG | Vss | Veg | Vcc |
| Substrate | Vss | Vds | Vss |

FIGS. 7A–7D show the timing of a programming sequence, and the programming operation is explained below according to these figures. It is noted that before the programming operation is started, the memory cells are erased so that the threshold voltages of the memory cells are at a low state (data "1").

First, the voltage Vss is applied to the source select gate signal line SSG. Then, the select transistors ST21–ST2m turn off, so that the common source line CSL is disconnected from the local source lines LSL0–LSLm. Thus, the sources of the memory cells M11–Mnm are placed in a floating state. Further, the voltage Vpd (>Vinh+Vth, where Vth is the threshold voltage of the select transistors ST11–ST1m and Vinh is a write inhibit voltage which will be described later.) is applied to the drain select gate signal line DSG, so that the select transistors ST11–ST1m turn on. Thus, the local bit lines LBL0–LBLm are connected with the main bit lines BL0–BLm, respectively. Next, a specified voltage is applied to the main bit lines BL0–BLm. Specifically, the voltage Vss (e.g., 0 V) is applied to the main bit lines BL (representing BL0–BLm) to program, or write data "0" to the memory cells M11–Mnm, while the write inhibit voltage Vinh (e.g., +6 V) is applied to the main bit lines BL to write data "1". The write inhibit voltage Vinh is applied to the drain, source and channel region via the main bit line BL, so that electrons are not injected from the channel region side into the floating gate. Subsequently, the voltage Vpp is applied to a selected word line WL (one of the word lines WL0–WLm) for a write time tw.

In programming data "1" in the above sequence, since the voltage Vpp is applied to the word line WL, electrons are induced to the channel region, which makes the drain and the source short-circuited. Therefore, because the drain of the memory cell has the voltage Vss, the source also has the voltage Vss. Then, a high electric field is generate d between the floating gate and the source, between the floating gate and the drain, and between the floating gate and the channel region, causing electrons to be injected from the source, drain and channel region to the floating gate. Thus, the threshold voltage of the memory cell becomes high.

In writing data "1" in the programming sequence, because the voltage Vpp is applied to the word line WL, electrons are induced to the channel region, making the drain and the source short-circuited as in the case of writing data "0". Because the drain of the memory cell has the voltage Vinh, the source also has the voltage Vinh. Therefore, the electric field between the channel region and the floating gate is relaxed, so that electrons are not injected into the floating gate. Therefore, the threshold voltage is maintained at the low state.

For collective erasing of the memory cell array 8, two ways are available as shown in FIGS. 8A–8E and FIGS. 9A–9F.

The erase sequence (a first one) shown in FIGS. 8A–8E is explained below.

First, the voltage Veg (e.g., +8 V) is applied to the source select gate signal line SSG and the drain select gate signal line DSG (Veg >(Vds+Vth), where Vth is the threshold voltage of the select transistors ST11–ST1m and ST21–ST2m). Then, all the select transistors ST11–ST1m and ST21–ST2m turn on. Thus, the local source lines LSL0–LSLm are connected with the common source line CSL, while the main bit lines BL0–BLm are connected with the local bit lines LBL0–LBLm, respectively. Next, the voltage Vds (e.g., 0 V to +6 V) is applied to the semiconductor substrate, the main bit lines BL and the common source line CSL. Further, the voltage Vneg (e.g., –8 V) is applied to all the word lines WL in the memory cell array. Because the voltage Vneg is applied to the word lines WL, no channel is formed, but the potentials of the source and the drain approach Vds. As a result, a high electric field is generated between the source and the floating gate, between the channel region and the floating gate, and between the drain and the floating gate in all the memory cells. Thus, in each memory cell, electrons are extracted from the floating gate, while the holes within the channel region are injected into the tunnel oxide and the floating gate. As a result, the threshold voltage is lowered. The extraction of the electrons may be performed only between the floating gate and the channel region and between the floating gate and the drain, with the source placed in a floating state.

Next, the erase sequence (a second one) shown in FIGS. 9A–9E is explained below.

First, the voltage Vss is applied to the source select gate signal line SSG and the drain select gate signal line DSG. Then, all the select transistors ST11–ST1m and ST21–ST2m turn off, resulting in that the local bit lines LBL0–LBLm and the local source lines LSL0–LSLm are placed in a floating state. Next, the voltage Vds is applied to the semiconductor substrate and the common source line CSL, and the voltage Vneg is applied to the word lines WL for an erase time tE. As a result, a high electric field is generated between the channel region and the floating gate in every memory cell, so that electrons are extracted from the floating gate while the holes within the channel region are injected into the tunnel oxide and the floating gate. This results in the threshold voltage being lowered.

When employing the first erase sequence, injection/extraction of electrons is done between the source and the floating gate, between the channel region and the floating gate, and between the drain and the floating gate in the erase operation as well as in the programming operation, so that traps are unlikely to occur in portions of the tunnel oxide opposite to the drain and source. In contrast to this, in the second erase sequence, because the source and the drain are floating during the erasing, traps may occur in those portions of the tunnel oxide opposite to the source and drain. However, the second erase sequence does not need that the high voltage Veg be generated, allowing the high voltage pump 1 to generate a lower voltage and thus allowing the layout area of the high voltage pump 1 to be made smaller, as compared with the first erase sequence.

Figure 23:
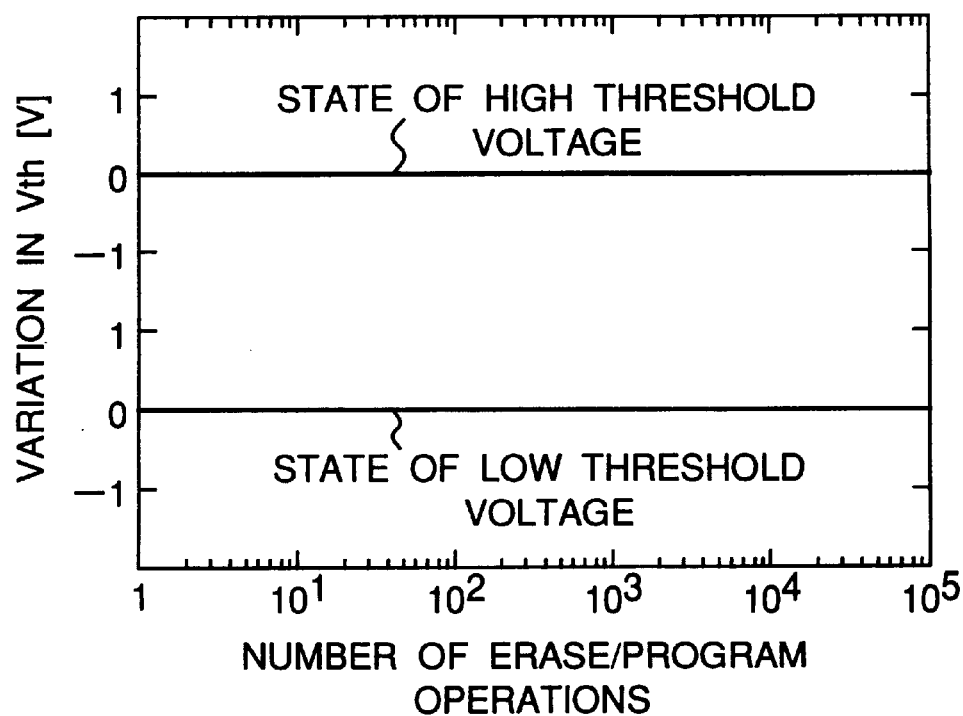
FIG. 23 is a diagram showing improved endurance characteristics of the AND type and DINOR type flash memories.
Figure 24:
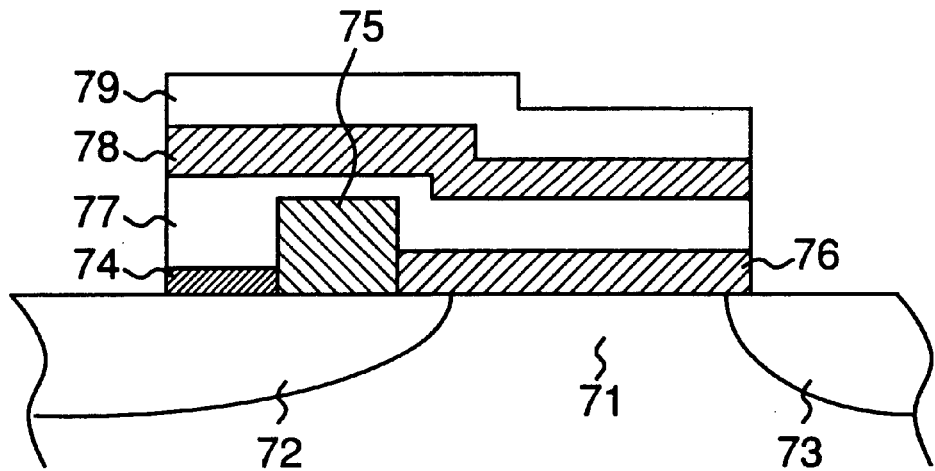
FIG. 24 is a sectional view showing the basic structure of memory cells of the prior art ACEE type flash memory.
Figure 25:
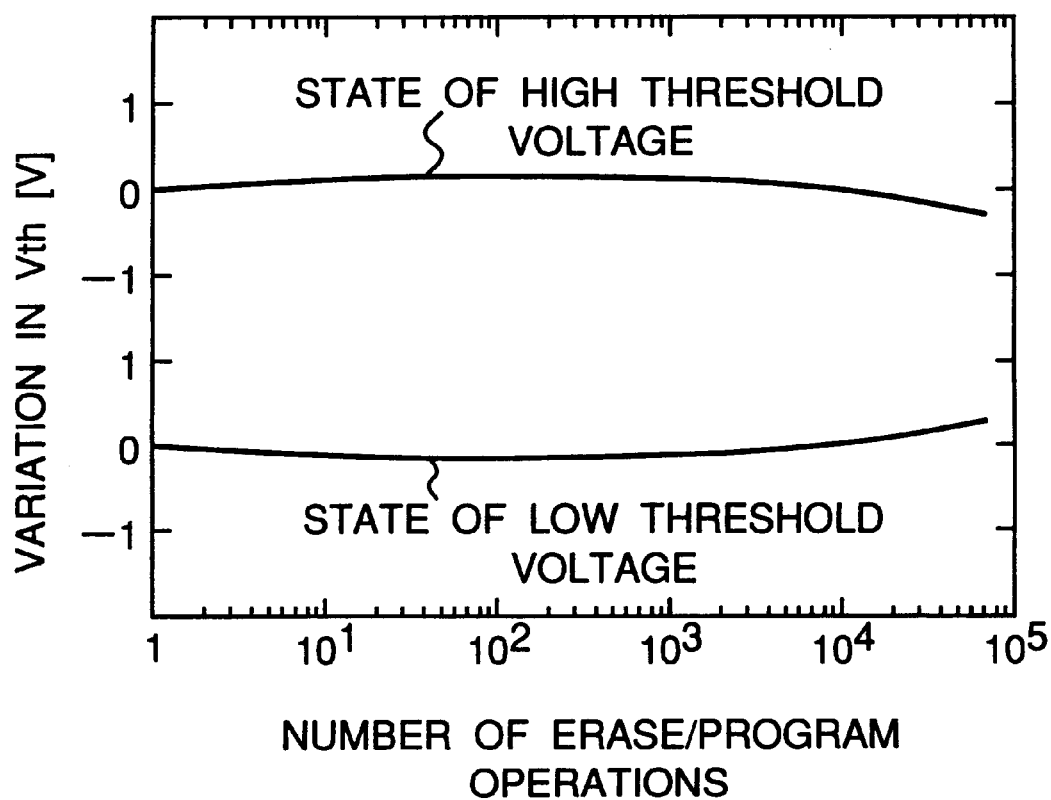
FIG. 25 is a diagram showing the endurance characteristics of the ACEE type flash memory.
Figure 26:
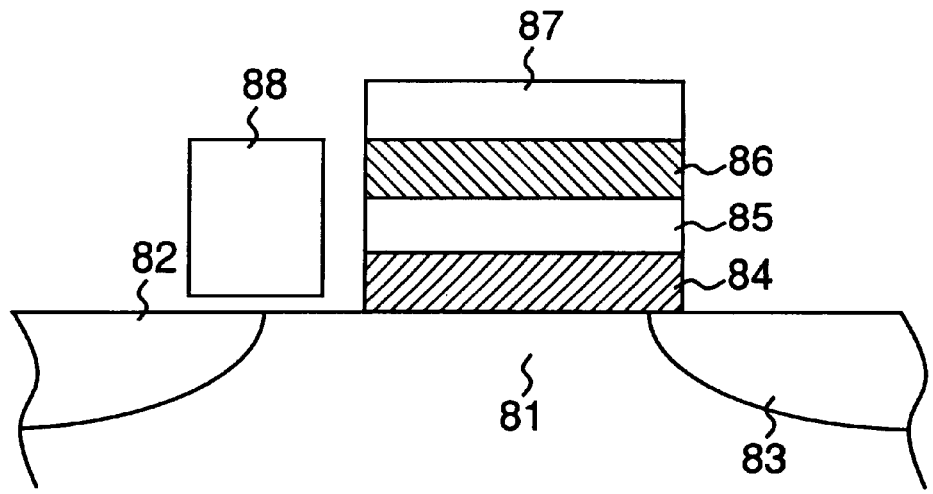
FIG. 26 is a sectional view showing the basic structure of the prior art flash memory with select gate.
Figure 27:
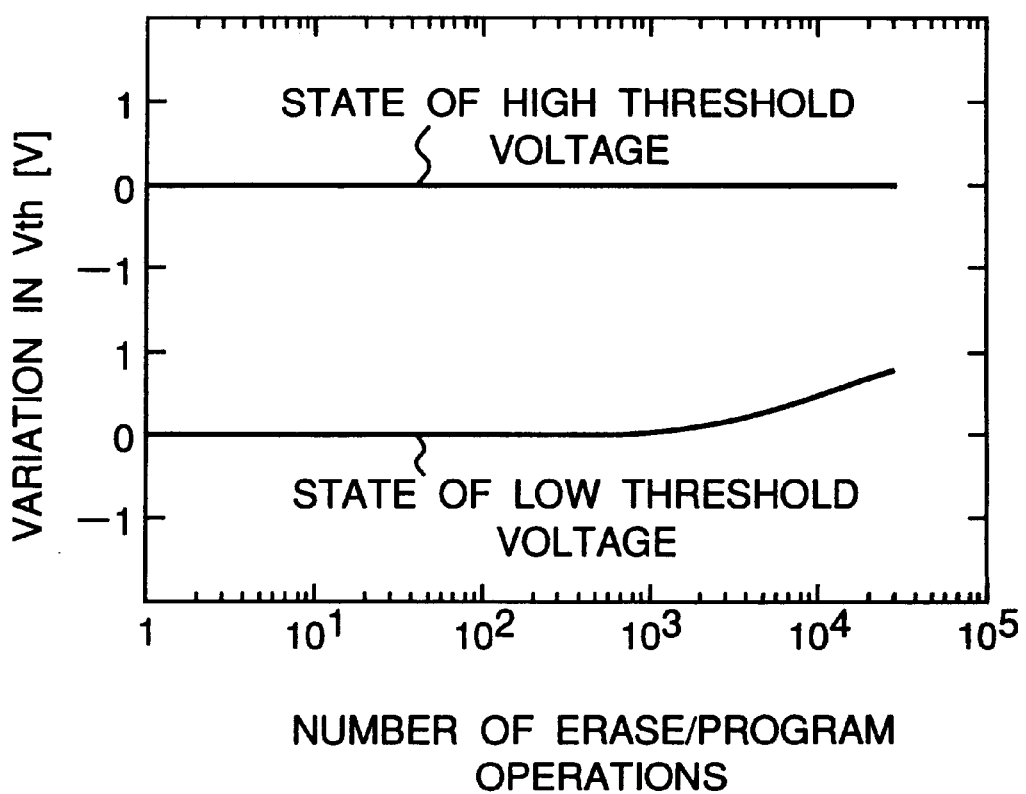
FIG. 27 is a diagram showing endurance characteristics of the flash memory with select gate.
Figure 28:
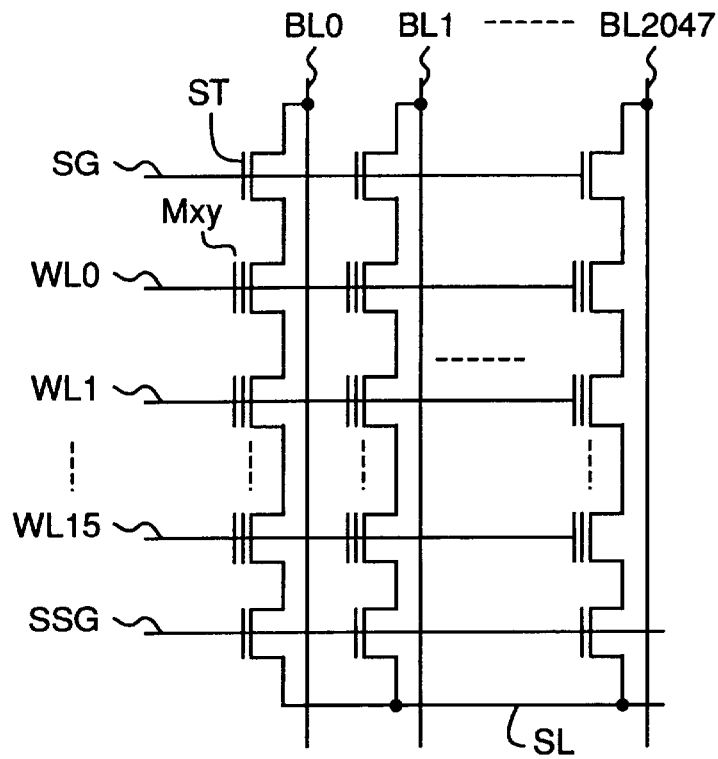
FIG. 28 is a circuit diagram showing the arrangement of a memory cell array of the prior art NAND type flash memory.
Figure 29:
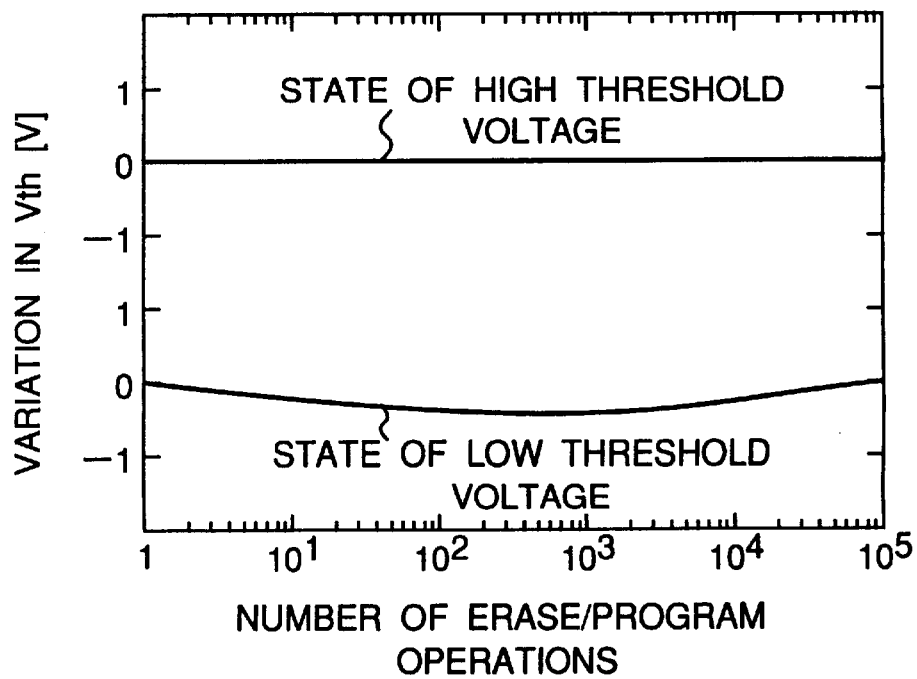
FIG. 29 is a diagram showing endurance characteristics of the NAND type flash memory.
Figure 30:
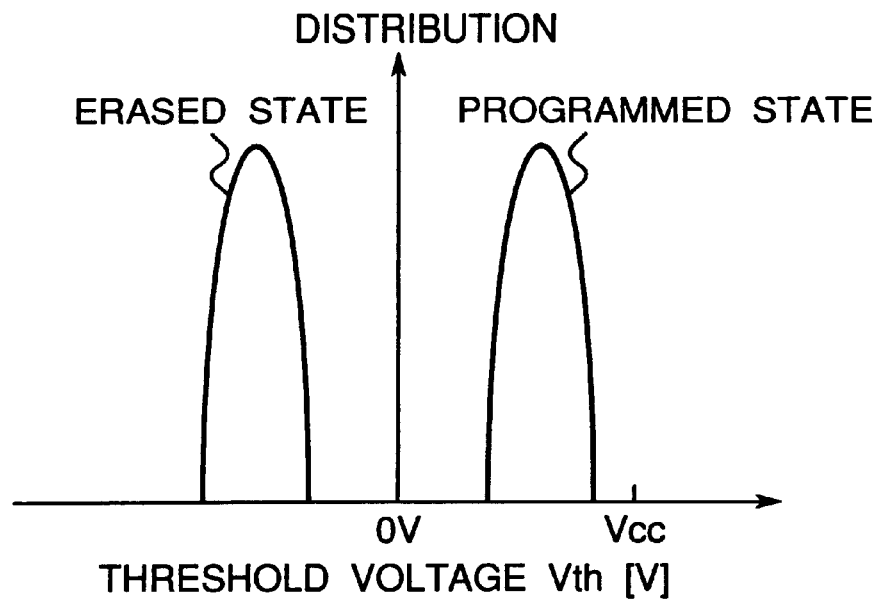
FIG. 30 is a diagram showing the threshold voltage distributions in the erase and programming states of the memory cells of the NAND type flash memory.
Figure 31:
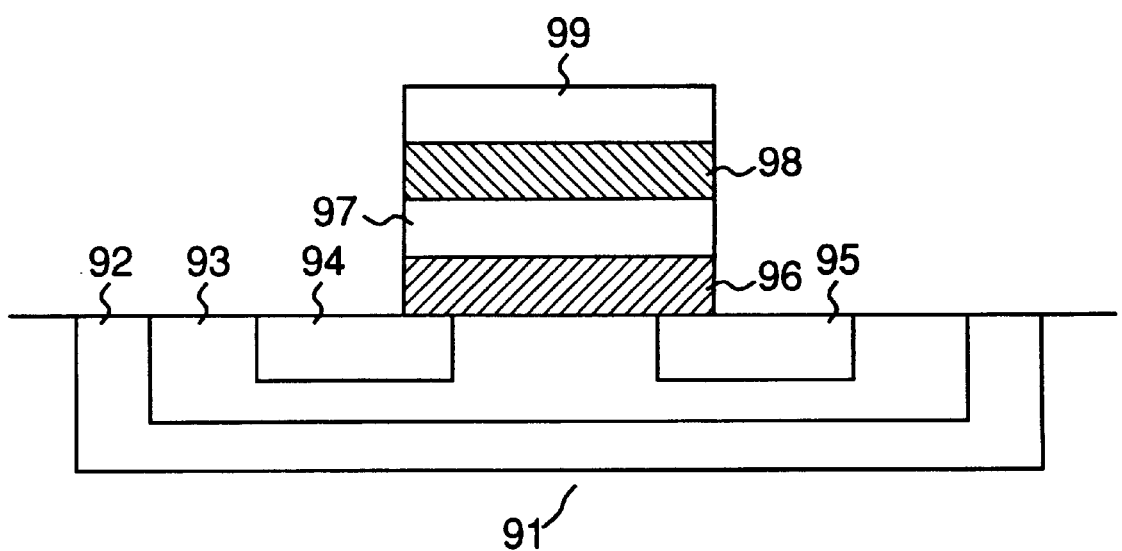
FIG. 31 is a sectional view showing the basic structure of a memory cell of another prior art flash memory.

As shown above, in the NOR type flash memory, injection/extraction of electrons is performed via the tunnel oxide in the same region between the channel region and the floating gate of the memory cell. Accordingly, a higher access speed as well as a higher integration degree can be achieved, and also, good endurance characteristics as shown in FIG. 23 are obtained.

Also, according to the first embodiment, in programming data "0", the source, drain and channel region each have the voltage Vss serving as the reference voltage, and the control gate has the positive voltage Vpp, so that an electric field where the floating gate side is higher in potential, is generated between the drain and the floating gate, between the source and the floating gate and between the channel region and the floating gate. On the other hand, in erasing data of the memory cells, the semiconductor substrate is given the positive voltage Vds and the control gates of the memory cells M11–Mnm are given the negative voltage Vneg, so that an electric field where the potential is lower on the floating gate side, is generated between the channel region and the floating gate. In short, positive and negative electric fields are applied to the tunnel oxide in the injection/ejection of electrons.

Also, because the Fowler-Nordheim tunneling is utilized for the injection of electrons into the floating gate of the memory cells M11–Mnm as well as the ejection, or extraction of electrons from the floating gate, the current used for the programming is extremely smaller than that in a case where channel hot electrons are used for electron injection into the floating gate. Thus, many memory cells can be programmed at the same time and yet the current consumption can be reduced.

Further, for erasing, a high electric field of a polarity opposite to that in the injection of electrons into the floating gate of the memory cells M11–Mnm is generated not only between the channel region and the floating gate but also between the drain and the floating gate and between the source and the floating gate, so that electrons are ejected from the floating gate of the memory cells M11–Mnm to the drain, source and channel region via the tunnel oxide. Thus, both the injection and the extraction of electrons are performed via the tunnel oxide on the source, drain and channel region, so that the endurance characteristics are well improved.

Second Embodiment

Figure 10:
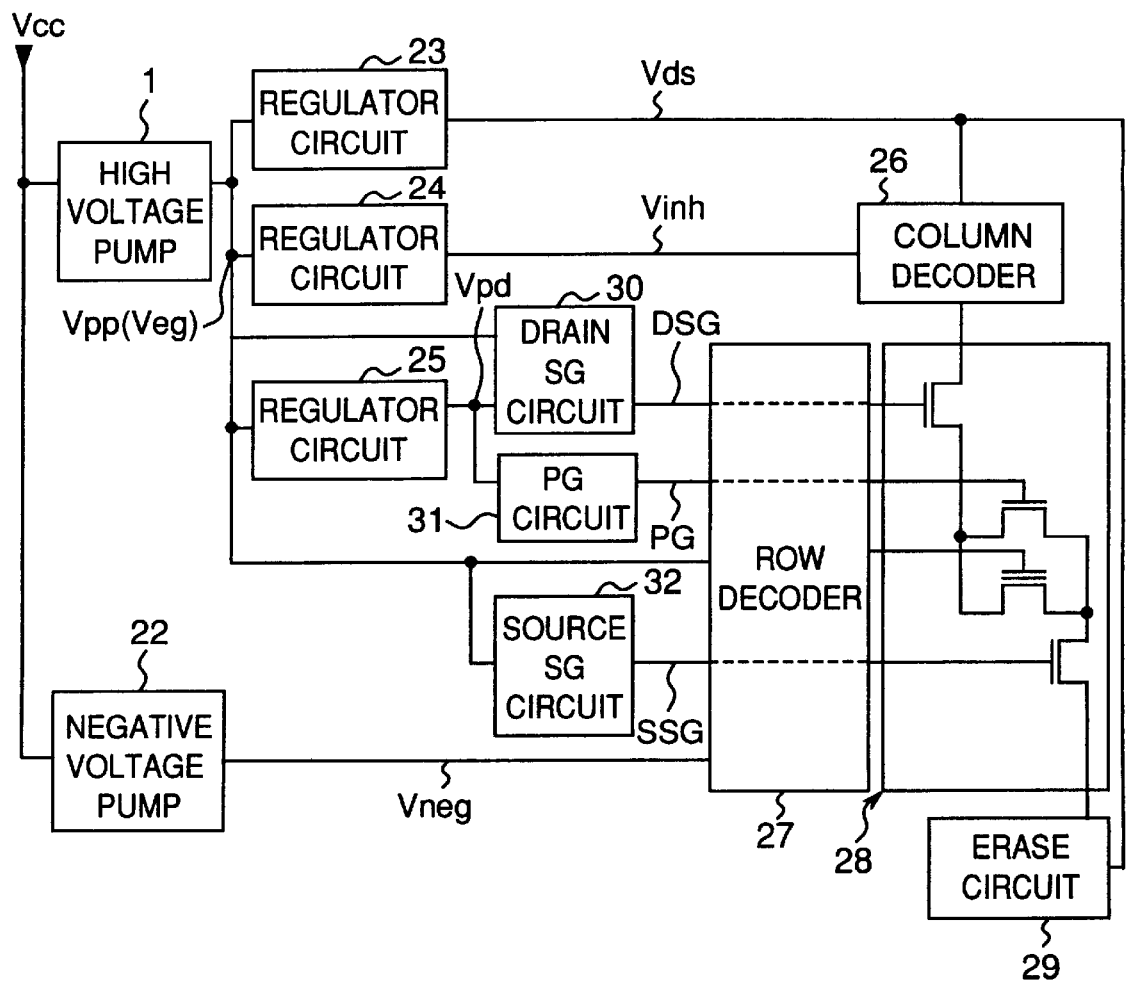
FIG. 10 is a schematic block diagram of a nonvolatile semiconductor storage device according to a second embodiment of the present invention.

FIG. 10 is a schematic block diagram of a NOR type flash memory as the nonvolatile semiconductor storage device according to a second embodiment of the present invention. This flash memory has the substantially same basic memory cell structure as that shown in FIG. 16, and the applied voltage conditions for each operation of the flash memory are also the same as in Table 9 of the first embodiment.

As shown in FIG. 10, the flash memory has a high voltage pump 21 which, upon receipt of a voltage Vcc, supplies a boosted positive voltage Vpp (Veg) as the second voltage, a negative voltage pump 22 which, upon receipt of the voltage Vcc, supplies a boosted negative voltage Vneg as the fourth voltage, a regulator circuit 23 which, upon receipt of the positive voltage Vpp from the high voltage pump 21, supplies a voltage Vds as the third voltage, a regulator circuit 24 which, upon receipt of the positive voltage Vpp from the high voltage pump 21, supplies a voltage Vinh, a regulator circuit 25 which, upon receipt of the positive voltage Vpp from the high voltage pump 21, supplies a voltage Vpd. The flash memory also has a column decoder 26 which, upon receipt of the voltage Vds from the regulator circuit 23 and the voltage Vinh from the regulator circuit 24, selects a bit line, a row decoder 27 which, upon receipt of the positive voltage Vpp from the high voltage pump 21, selects a word line, a memory cell array 28 in which a plurality of memory cells (only one of which is shown in FIG. 10) are arrayed in a matrix shape, an erase circuit 29 which, upon receipt of the voltage Vds from the regulator circuit 23, executes the erasing of data of the memory cells, a drain sg (select gate) circuit 30 which, upon receipt of the positive voltage Vpp from the high voltage pump 21 and the voltage Vpd from the regulator circuit 25, supplies a signal to a drain select gate signal line DSG, a PG circuit 31 which, upon receipt of the voltage Vpd from the regulator circuit 25, supplies a signal to a pass transistor gate signal line PG, and a source sg (select gate) circuit 32 which, upon receipt of the positive voltage Vpp from the high voltage pump 21, supplies a signal to a source select gate signal line SSG.

Figure 11:
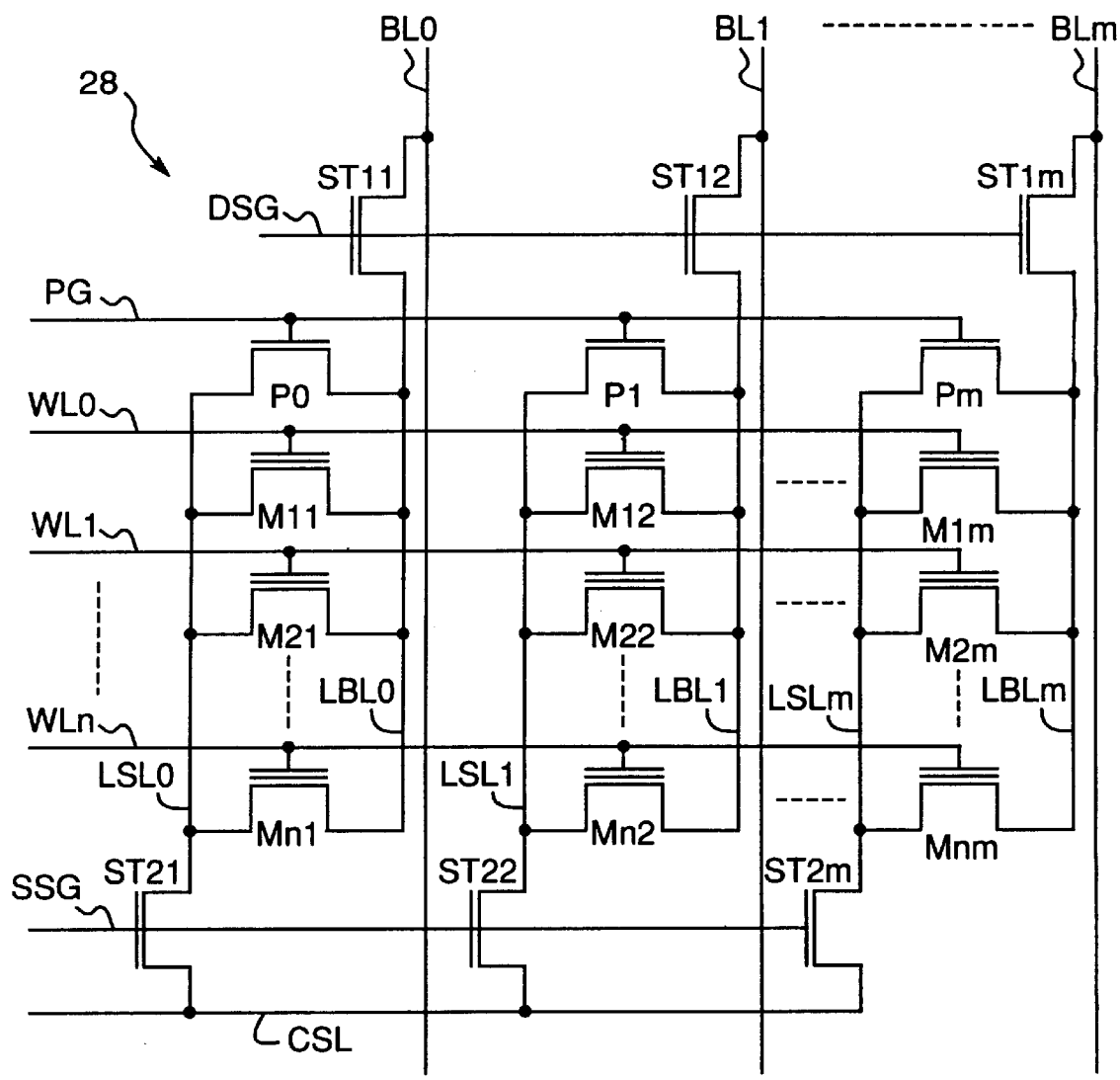
FIG. 11 is a circuit diagram of a memory cell array of the nonvolatile semiconductor storage device.

FIG. 11 shows the arrangement of the memory cell array 28 shown in FIG. 10. This memory cell array 28 has the same arrangement as the memory cell array of the first embodiment shown in FIG. 3 except pass transistors P0–Pm which will be described later. Therefore, in FIG. 11, the same component parts as those of FIG. 3 are designated by the same reference symbols, and description on those component parts will be omitted here.

In this memory cell array 28, local bit lines LBL0–LBLm are connected with local source lines LSL0–LSLm via the pass transistors P0–Pm serving as the third MOS transistors, respectively.

Table 10 shows applied voltage conditions for each operational mode of the flash memory.

TABLE 10

|  | Program | Erase | Read |
| --- | --- | --- | --- |
| WL (select) | Vpp | Vneg | Vcc |
| WL (nonselect) | Vss | — | Vss |
| BL (data 0) | Vss | F(Vds) | Vbias |
| BL (data 1) | Vinh | — | — |
| PG | Vpd | Veg | Vcc |
| DSG | Vpd | Veg | Vcc |

TABLE 10-continued

|  | Program | Erase | Read |
| --- | --- | --- | --- |
| SSG | Vss | Veg | Vcc |
| Substrate | Vss | Vds | Vss |

FIGS. 12A–12E show a programming sequence of the flash memory. First, the voltage Vss as the first voltage is supplied to the source select gate signal line SSG. Thus, the select transistors ST21–ST2m turn off so that the local source lines LSL0–LSLm are disconnected from the common source line CSL, causing the sources of the memory cells to be floating. Further, the voltage Vpd (>Vinh+Vth, where Vth is the threshold voltage of the select transistors ST11–ST1m and Vinh is a write inhibit voltage which will be described later) is applied to the drain select gate signal line DSG and the pass transistor gate signal line PG. Thus, the select transistors ST11–ST1m turn on so that the local bit lines LBL0–LBLm are connected with the corresponding main bit lines BL0–BLm, respectively. At the same time, the pass transistors P0–Pm turn on so that the local bit lines LBL0–LBLm are connected with the corresponding local source lines LSL0–LSLm, respectively. Next, specified voltages are applied to the main bit lines BL (representing BL0–BLm). Specifically, the voltage Vss (e.g., 0 V) is applied to the main bit line BL for programming data "0", while the write inhibit voltage Vinh (e.g., +6 V, the same as in the first embodiment) is applied to the main bit line BL for programming data "1". Subsequently, the voltage Vpp is applied to a word line WL for a write time tw.

In writing data "0" in the above programming sequence, the voltage Vpp is applied to the word line WL after the potentials of the drains of the memory cells have become Vss and the potentials of the sources have also become Vss via the pass transistors P0–Pm. Therefore, electrons are induced in the channel region, causing a high electric field to be generated between the floating gate and the channel region, so that electrons are injected from the channel region into the floating gate via the tunnel oxide. As a result, the memory cell has an elevated threshold voltage.

In writing data "1" in the programming sequence, the voltage Vpp is applied to the word line WL after the potentials of the drains have become Vinh and the potentials of the sources have also become Vinh via the pass transistors P0–Pm. Therefore, the electric field between the channel region and the floating gate is relaxed so that electrons are not injected into the floating gate. Therefore, the threshold voltage is maintained at the low state.

FIGS. 13A–13G show an erase sequence. In this case also, two ways are available like the second embodiment, but only one of them is explained here.

First, the voltage Vss is applied to the pass transistor gate signal line PG, the source select gate signal line SSG and the drain select gate signal line DSG. As a result, all the select transistors ST11–ST1m and ST21–ST2m turn off, making the local bit lines LBL0–LBLm and the local source lines LSL0–LSLm floating. Next, the voltage Vds is applied to the semiconductor substrate, and then the voltage Vneg is applied to the word line WL for the erase time tE. As a result, a high electric field is generated between the channel region and the floating gate in all the memory cells, where electrons are pulled out from the floating gate while holes within the channel region are injected into the tunnel oxide and the floating gate. Thus, the threshold voltage gets lowered.

As is obvious from the above, in the NOR type flash memory, injection/extraction of electrons is performed via the same region of the tunnel oxide between the channel region and the floating gate of the memory cells M11–Mnm. Accordingly, a higher access speed as well as a higher degree of integration is achievable, and good endurance characteristics as shown in FIG. 23 are also achievable.

In the foregoing first embodiment, in programming data "1", for which the threshold voltage of the memory cell should be in a low state, if the potential of the control gate is Vpp (e.g., +15 V), the potential of the drain is Vds (e.g., +6 V) and the source is floating, current flows from the drain toward the source until the potential of the source reaches nearly Vds. In this case, channel hot electrons, although small in quantity, are generated near the drain, causing a disturb so that electrons enter the floating gate. This leads to a problem that the threshold voltage increases. In contrast to this, in this second embodiment, the sources are connected to the drains via the pass transistor P0–Pm, and not floating, so that current due to the channel hot electrons do not flow. Therefore, the threshold voltage of the memory cell is maintained at the low level.

Also, according to the second embodiment, in programming data "0", the source, drain and channel region each have the voltage Vss serving as the reference voltage, and the control gate has the positive voltage Vpp, so that an electric field where the floating gate side is higher in potential, is generated between the drain and the floating gate, between the source and the floating gate and between the channel region and the floating gate. On the other hand, in erasing data of the memory cells, the semiconductor substrate is given the positive voltage Vds and the control gates of the memory cells M11–Mnm are given the negative voltage Vneg, so that an electric field where the floating gate side has a lower potential, is generated between the channel region and the floating gate. In short, positive and negative electric fields are applied to the tunnel oxide in the injection/ejection of electrons.

Also, because the Fowler-Nordheim tunneling is utilized for the injection of electrons into the floating gate of the memory cells M11–Mnm as well as the ejection or extraction of electrons from the floating gate, the current used for the programming is extremely smaller than that in a case where channel hot electrons are used for electron injection into the floating gate. Thus, many memory cells can be programmed at the same time and yet the current consumption can be reduced.

Further, for erasing, a high electric field of a polarity opposite to that in the injection of electrons into the floating gate of the memory cells M11–Mnm is generated not only between the channel region and the floating gate but also between the drain and the floating gate and between the source and the floating gate, so that electrons are ejected from the floating gate of the memory cells M11–Mnm to the drain, source and channel region via the tunnel oxide. Thus, the injection/extraction of electrons into/from the floating gate is performed via the tunnel oxide on the source, drain and channel region, so that the endurance characteristics are well improved.

Third Embodiment

FIG. 14 is a schematic block diagram of a NOR type flash memory as the nonvolatile semiconductor storage device according to a third embodiment of the present invention. This flash memory has substantially the same basic memory cell structure as that shown in FIG. 16, and the applied voltage conditions for each operation of the flash memory are also the same as those in Table 9 of the first embodiment.

Table 11 shows applied voltage conditions for each operational mode of the flash memory.

TABLE 11

|  | Program | Erase | Read |
| --- | --- | --- | --- |
| WL (select) | Vpp | Vneg | Vcc |
| WL (nonselect) | Vss | — | Vss |
| BL (data 0) | Vss | Vds(F) | Vbias |
| BL (data 1) | Vinh | — | — |
| DSG | Vcc | Veg | Vcc |
| SSG | Vss | Veg | Vcc |
| Substrate | Vss | Vds | Vss |

As shown in FIG. 14, the flash memory has a high voltage pump 31 which, upon receipt of a voltage Vcc, supplies a boosted positive voltage Vpp (Veg) as the first voltage, a negative voltage pump 32 which, upon receipt of the voltage Vcc, supplies a boosted negative voltage Vneg as the fourth voltage, a regulator circuit 33 which, upon receipt of a positive voltage Vpp from the high voltage pump 31, supplies a voltage Vds as the third voltage, a regulator circuit 34 which, upon receipt of the positive voltage Vpp from the high voltage pump 31, supplies a voltage Vpd, a column decoder 36 which, upon receipt of the voltage Vds from the regulator circuit 33, selects a bit line, a row decoder 37 which, upon receipt of the positive voltage Vpp from the high voltage pump 31 and the negative voltage Vneg from the negative voltage pump 32, selects a word line, a memory cell array 38 in which a plurality of memory cells (only one of which is shown in FIG. 14) are arrayed in a matrix shape, an erase circuit 39 which, upon receipt of the voltage Vds from the regulator circuit 33, executes the erasing of memory cells, a drain sg (select gate) circuit 40 which, upon receipt of the positive voltage Vpp from the high voltage pump 31 and the voltage Vpd from the regulator circuit 34, supplies a signal to a drain select gate signal line DSG, and a source sg (select gate) circuit 41 which, upon receipt of the positive voltage Vpp from the high voltage pump 31, supplies a signal to a source select gate signal line SSG.

The memory cell array of this flash memory has the same arrangement as that of the memory cell array of the first embodiment shown in FIG. 3. Therefore, FIG. 3 will be referred to in the following description.

A programming operation of this flash memory is explained below according to the programming sequence shown in FIGS. 15A–15D.

First, the voltage Vss as the first voltage is applied to the source select gate signal line SSG. Then, all the select transistors ST21–ST2m turn off so that the common source line CSL is disconnected from the local source lines LSL0–LSLm. Thus, the sources of the memory cells become floating. Further, the voltage Vcc as the fifth voltage is applied to the drain select gate signal line DSG. Then, all the select transistors ST11–ST1m turn on so that the local bit lines LBL0–LBLm are connected with the main bit lines BL0–BLm, respectively. Next, specified voltages are applied to the main bit lines BL (representing BL0–BLm) in the memory cell array 8 shown in FIG. 3 in accordance with data to be written. Specifically, the voltage Vss (e.g., 0 V) is applied to the main bit line BL to write data "0", while the voltage Vcc (e.g., +3 V) is applied to the main bit line BL to write data "1". Subsequently, the voltage Vpp is applied to a word line WL for a write time tw.

In programming data "0" according to the above sequence, since the voltage Vpp is applied to the word line WL, electrons are induced in the channel region, whereby the drain and the source are short-circuited. Therefore, when the potential of the drain of the memory cell becomes Vss, the potential of the source also becomes Vss, and a high electric field is generated between the floating gate and the channel region, causing electrons to be injected into the floating gate. Thus, the threshold voltage of the memory cell becomes high.

In programming data "1" according to the programming sequence, because the drain select gate signal line DSG and the bit line BL are at the potential Vcc, the select transistors ST11–ST1m turn on so that the drain potential is maintained at a level of (Vcc–Vth) (where, Vth is the threshold voltage of the select transistors ST11–ST1m). Further, when the potential of the word line WL is raised to Vpp, the drain potential is boosted by its coupling with the memory cell. In addition, the voltage of the channel region also increases to reach, for example, around +6 V, which value is higher than the voltage Vcc. Therefore, the electric field between the channel region and the floating gate is relaxed so that electrons are not injected into the floating gate. Thus, the threshold voltage is maintained low.

The third embodiment employs a memory cell erase method which is the same as that employed in the first embodiment.

As described above, in the NOR type flash memory of the third embodiment, injection/extraction of electrons is performed via the same tunnel oxide between the channel region and the floating gate of each memory cell M11–Mnm. Accordingly, a higher access speed as well as a higher degree of integration are achievable, and good endurance characteristics as shown in FIG. 23 are also obtained.

Also, in programming data "1" according to the third embodiment, because the voltage Vcc is applied to the drain and source of the memory cells M11–Mnm and the voltage Vpp is applied to the control gate, electrons are induced in the channel region between the drain and the source, causing these two to be short-circuited at the channel region. Then, the voltage Vcc is applied to the channel region. This applied voltage is boosted by coupling of the channel region with the control gate to become a voltage (+6 V in the third embodiment) higher than the voltage Vcc, so that the electric field between the channel region and the floating gate is relaxed. Thus, electrons are well prevented from being injected into the floating gate.

Further, the third embodiment contrasts with the preceding two embodiments in the method of programming data "1". Specifically, in the preceding two embodiments, the write inhibit voltage Vinh is generated by the regulator circuit 4, 24 from the voltage Vpp derived from the high voltage pump 1, 21, as shown in FIGS. 1 and 10. In contrast, in this third embodiment, the write inhibit voltage Vinh is not used, so that such a regulator circuit having a circuit construction shown in FIG. 2 is dispensed with. Since this regulator circuit requires a relatively large layout area because of the use of resistor elements, eliminating one regulator circuit reduces the overall layout area of the flash memory. Also in the flash memory of the present embodiment, because only the voltages Vcc and Vss are used in the decoder of the bit lines, the decoder does not need to be made resistant to high voltage. This aspect also contributes toward reduction of the overall layout area of the flash memory. Furthermore, the third embodiment involves neither disturbs nor pass transistors of the second embodiment, so that the layout area of the flash memory can be further reduced.

In programming data "0", the source, drain and channel region of the memory cells M11–Mnm have the voltage Vss serving as the reference voltage and the control gate has the voltage Vpp, so that an electric field with the potential being higher on the floating gate side is generated between the drain and the floating gate, between the source and the floating gate, and between the channel region and the floating gate. Also during the programming of data "1", the source and drain of the memory cells M11–Mnm have the positive voltage Vcc and the control gate has the positive voltage Vpp, so that the electric field which occurs between the channel region and the floating gate and in which the potential is higher on the floating gate side, is relaxed, thus preventing electrons from being injected into the floating gate. On the other hand, in the erasing operation, the semiconductor substrate has the positive voltage Vds and the control gates of the memory cells M11–Mnm become have the negative voltage Vneg, so that an electric field with the potential being lower on the floating gate side is generated between the channel region and the floating gate. Accordingly, positive and negative electric fields are applied to the tunnel oxide during the injection/ejection of electrons.

Further, in the erasing operation, a high electric field of a polarity opposite to that for the injection of electrons into the floating gates of the memory cells M11–Mnm is generated not only between the channel region and the floating gate but also between the drain and the floating gate and between the source and the floating gate, so that electrons are extracted from the floating gate of each memory cell M11–Mnm to the drain, source and channel region via the tunnel oxide. That is, the injection/extraction of electrons is performed via the tunnel oxide on the source, drain and channel region, so that the endurance characteristics can be well improved.

The above first to third embodiments have been described using the NOR type flash memory as an example of the nonvolatile semiconductor storage. However, it is needless to say that the nonvolatile semiconductor storage device is not limited to the flash memory. Any nonvolatile semiconductor storage device will do if the nonvolatile semiconductor storage device has a memory cell array in which memory cells are arrayed in a matrix form, the memory cells each being comprised of a floating gate type MOS transistor having a source and a drain formed in a semiconductor substrate at an interval, a tunnel oxide formed on the source, the drain and a channel region disposed between the source and the drain, a floating gate formed on the tunnel oxide, an interlayer insulating film formed on the floating gate, and a control gate formed on the interlayer insulating film, and if the nonvolatile semiconductor storage device also has word lines which each are connected with the control gates of the memory cells in respective rows, local bit lines which each are connected with the drains of the memory cells in respective columns, main bit lines which are connected with the corresponding local bit lines via respective first MOS transistors, local source lines which each are connected with the sources of the memory cells in the respective columns, and a common source line which is connected with the local source lines via respective second MOS transistors.

Furthermore, the values of the first voltage Vss to the fifth voltage Vcc employed in the first to third embodiments are given only by way of example, and are not limitative. The voltages may be set to any appropriate values depending on the design of the memory cells, memory cell array and the like.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of driving a nonvolatile semiconductor storage device, wherein said nonvolatile semiconductor storage device comprises a memory cell array in which memory cells, each comprised of a floating gate type MOS transistor, are arrayed in a matrix form, each memory cell having a source and a drain formed on a semiconductor substrate and spaced from each other, a tunnel oxide formed on the source and drain and on a channel region disposed between the source and the drain, a floating gate formed on the tunnel oxide, an interlayer insulating film formed on the floating gate, and a control gate formed on the interlayer insulating film, and said nonvolatile semiconductor storage device further comprises word lines each connected with the control gates of the memory cells in respective rows, local bit lines each connected with the drains of the memory cells in respective columns, main bit lines connected with the corresponding local bit lines via respective first MOS transistors, local source lines each connected with the sources of the memory cells in respective columns, and a common source line connected with the local source lines via respective second MOS transistors, said method comprising:

(a) in an programming operation in which electrons are injected into the floating gate of a memory cell to be programmed, applying a first voltage to the drain of the memory cell via the corresponding main bit line, the corresponding first MOS transistor, and the corresponding local bit line, and applying a second voltage to the control gate of the memory cell via the corresponding word line to thereby apply the first voltage to the channel region and the source of the memory cell, so that electrons are injected into the floating gate of the memory cell from the drain, the source and the channel region of the memory cell via the tunnel oxide; and (b) in an erasing operation, applying a third voltage to the semiconductor substrate while applying a fourth voltage to the control gate of the memory cell via the corresponding word line so that electrons are extracted from the floating gate to the channel region of the memory cell via the tunnel oxide.

2. The method of driving a nonvolatile semiconductor storage device according to claim 1, wherein in the programming operation, the second MOS transistor is turned off to disconnect the local source line from the common source line.

3. The method of driving a nonvolatile semiconductor storage device according to claim 1, wherein the first voltage is a reference potential and the second voltage is a positive voltage; and the third voltage is a positive voltage and the fourth voltage is a negative voltage.

4. The method of driving a nonvolatile semiconductor storage device according to claim 1, which utilizes Fowler-Nordheim tunneling for the injection of electrons into the floating gate of the memory cell and the extraction of electrons from the floating gate.

5. The method of driving a nonvolatile semiconductor storage device according to claim 1, wherein in extracting the electrons from the floating gate of the memory cell, the third voltage is also applied both to the drain of the memory cell via the main bit line, first MOS transistor and local bit line and to the source of the memory cell via the common source line, the second MOS transistor and the local source line.

6. The method of driving a nonvolatile semiconductor storage device according to claim 1, wherein in extracting the electrons from the floating gate of the memory cell, the first and second MOS transistors are turned off so that both the drain and the source of the memory cell are placed in a floating state.

7. The method of driving a nonvolatile semiconductor storage device according to claim 1, providing the nonvolatile semiconductor storage device with third MOS transistors for connecting the local bit lines with the respective local source lines.

8. The method of driving a nonvolatile semiconductor storage device according to claim 7, wherein in a programming operation in which electrons are not injected into the floating gate of a memory cell to be programmed, the corresponding local source line is disconnected from the common source line by turning off the corresponding second MOS transistor, and is connected with the local bit line by turning on the corresponding third MOS transistor.

9. The method of driving a nonvolatile semiconductor storage device according to claims 1, further comprising:

(c) in an programming operation in which electrons are not injected into the floating gate of a memory cell to be programmed, applying a fifth voltage to the drain of the memory cell via the corresponding main bit line, the corresponding first MOS transistor, and the corresponding local bit line, and applying the second voltage to the control gate of the memory cell via the corresponding word line to thereby apply the fifth voltage to the channel region and the source of the memory cell, so that electrons are not injected into the floating gate of the memory cell from the channel region of the memory cell via the tunnel oxide.

10. The method of driving a nonvolatile semiconductor storage device according to claim 9, wherein, upon applying the fifth voltage to the drain and source of the memory cell and applying the second voltage to the control gate thereof, the channel region is boosted by coupling of the channel region with the control gate such that the channel region has a voltage higher than the fifth voltage.

11. The method of driving a nonvolatile semiconductor storage device according to claim 9, wherein the first voltage is a reference potential and the second voltage is a positive voltage;

the third voltage is a positive voltage and the fourth voltage is a negative voltage; and the fifth voltage is a positive voltage higher than the reference potential.

12. A method of driving a nonvolatile semiconductor storage device, wherein said nonvolatile semiconductor storage device comprises a memory cell array in which memory cells, each comprising a floating gate type MOS transistor, are arrayed in a matrix form, each memory cell having a source and a drain formed on a semiconductor substrate and spaced from each other, a tunnel oxide formed on the source and drain and on a channel region disposed between the source and the drain, a floating gate formed on the tunnel oxide, an interlayer insulating film formed on the floating gate, and a control gate formed on the interlayer insulating film, and said nonvolatile semiconductor storage device further comprises word lines each connected with the control gates of the memory cells in respective rows, local bit lines each connected with the drains of the memory cells in respective columns, main bit lines connected with the corresponding local bit lines via respective first MOS transistors, local source lines each connected with the sources of the memory cells in respective columns, and a common source line connected with the local source lines via respective second MOS transistors, said method comprising:

in programming a memory cell, applying a specified voltage to the main bit line and applying a predetermined voltage to the word line connected with the memory cell such that the specified voltage on the main bit line is applied to the drain of the memory cell and then to the channel region and source thereof, so that electrons are injected into the floating gate of the memory cell from the drain, the source and the channel region of the memory cell via the tunnel oxide, the corresponding second MOS transistor being turned off to disconnect the local source line connected with the memory cell from the common source line, and the first MOS transistor being turned on to connect the local bit line connected with the memory cell with the corresponding main bit line.

13. A method of driving a nonvolatile semiconductor storage device, wherein said nonvolatile semiconductor storage device comprises a memory cell array in which memory cells, each comprised of a floating gate type MOS transistor, are arrayed in a matrix form, each memory cell having a source and a drain formed on a semiconductor substrate and spaced from each other, a tunnel oxide formed on the source and drain and on a channel region disposed between the source and the drain, a floating gate formed on the tunnel oxide, an interlayer insulating film formed on the floating gate, and a control gate formed on the interlayer insulating film, and said nonvolatile semiconductor storage device further comprises word lines each connected with the control gates of the memory cells in respective rows, local bit lines each connected with the drains of the memory cells in respective columns, main bit lines connected with the corresponding local bit lines via respective first MOS transistors, local source lines each connected with the sources of the memory cells in respective columns, a common source line connected with the local source lines via respective second MOS transistors, and third MOS transistors for connecting the local bit lines with the respective local source lines, said method comprising:

(a) in an programming operation,
  disconnecting the local source line connected with a memory cell to be programmed from the common source line by turning off the corresponding second MOS transistor so as to place the source of the memory cell in a floating state;
  connecting the local bit line with the corresponding main bit line by turning on the corresponding first MOS transistor;
  connecting the local bit line also with the local source line now disconnected from the common source line by turning on the corresponding third MOS transistor; and
  (i) in case of injecting electrons into the floating gate of the memory cell,
    applying a first voltage to the drain and source of the memory cell via the corresponding main bit line, local bit line and local source line connected with one another by the first and third MOS transistors turned on, and applying a second voltage to the control gate of the memory cell via the corresponding word line to thereby apply the first voltage to the channel region of the memory cell, so that electrons are injected into the floating gate of the memory cell from the drain, the source and the channel region of the memory cell via the tunnel oxide,
  (ii) in case of not injecting electrons into the floating gate of the memory cell,
    applying a write inhibit voltage to the drain and source of the memory cell via the corresponding main bit line, local bit line and local source line connected with one another by the first and third MOS transistors turned on, and applying the second voltage to the control gate of the memory cell via the corresponding word line to thereby apply the write prohibit voltage to the channel region of the memory cell so that electrons are not injected into the floating gate of the memory cell; and (b) in an erasing operation,
  applying a third voltage to the semiconductor substrate while applying a fourth voltage to the control gate of a memory cell to be erased via the corresponding word line so that electrons are extracted from the floating gate to the channel region of the memory cell via the tunnel oxide.

* * * * *